(12) United States Patent
Sano et al.

(10) Patent No.: US 9,196,476 B2
(45) Date of Patent: *Nov. 24, 2015

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventors: Atsushi Sano, Toyama (JP); Yoshiro Hirose, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/553,222

(22) Filed: Nov. 25, 2014

(65) Prior Publication Data

US 2015/0147891 A1 May 28, 2015

(30) Foreign Application Priority Data

Nov. 27, 2013 (JP) ................................. 2013-244776

(51) Int. Cl.
| | |
|---|---|
| H01L 21/20 | (2006.01) |
| H01L 21/02 | (2006.01) |
| C23C 16/34 | (2006.01) |
| H01L 21/228 | (2006.01) |
| C23C 16/30 | (2006.01) |
| C23C 16/455 | (2006.01) |

(52) U.S. Cl.
CPC ............ *H01L 21/0228* (2013.01); *C23C 16/30* (2013.01); *C23C 16/342* (2013.01); *C23C 16/45527* (2013.01); *C23C 16/45542* (2013.01); *C23C 16/45546* (2013.01); *H01L 21/0217* (2013.01); *H01L 21/02167* (2013.01); *H01L 21/228* (2013.01)

(58) Field of Classification Search
CPC ... H01L 21/0217; H01L 21/228; C23C 16/30; C23C 16/36; C23C 16/38; C23C 16/342
USPC ......................................................... 438/761
See application file for complete search history.

(56) References Cited

U.S. PATENT DOCUMENTS

| | | | | |
|---|---|---|---|---|
| 8,288,294 B2 * | 10/2012 | Kafuku et al. | ................. | 438/778 |
| 8,329,599 B2 | 12/2012 | Fukazawa et al. | | |
| 8,846,148 B2 * | 9/2014 | Kumada et al. | ......... | 427/255.394 |
| 2010/0098884 A1 | 4/2010 | Balseanu et al. | | |

FOREIGN PATENT DOCUMENTS

JP          2012531045 A       12/2012

* cited by examiner

*Primary Examiner* — Savitr Mulpuri
(74) *Attorney, Agent, or Firm* — Edell, Shapiro & Finnan LLC

(57) ABSTRACT

A thin film having a high resistance to HF and a low dielectric constant is formed with high productivity. A method of manufacturing a semiconductor device, includes performing a cycle a predetermined number of times, the cycle including: (a) supplying a source gas containing a predetermined element, carbon and a halogen element and having a chemical bond between the predetermined element and carbon to a substrate; and (b) supplying a reactive gas including a borazine compound to the substrate, wherein the cycle is performed under a condition where a borazine ring structure in the borazine compound and at least a portion of the chemical bond between the predetermined element and carbon in the source gas are preserved to form a thin film including the borazine ring structure and the chemical bond between the predetermined element and carbon on the substrate.

14 Claims, 17 Drawing Sheets

US 9,196,476 B2

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This application claims foreign priority under 35 U.S.C. §119(a)-(d) to Application No. JP 2013-244776 filed on Nov. 27, 2013, entitled "Method of Manufacturing Semiconductor Device, Substrate Processing Apparatus and Non-Transitory Computer-Readable Recording Medium," the entire contents of which are hereby incorporated by reference.

FIELD OF THE INVENTION

The present invention relates to a method of manufacturing a semiconductor device including a process of forming a thin film on a substrate, a substrate processing apparatus and a non-transitory computer-readable recording medium.

BACKGROUND

Along with miniaturization of transistors, in a thin film such as an insulating film forming a sidewall spacer (SWS) or the like of a gate electrode, a decrease in a film-forming temperature, a high resistance to hydrogen fluoride (HF), and a decrease in a dielectric constant are necessary. Accordingly, as the insulating film, employing a silicon boron nitride film (SiBN film) obtained by adding boron (B) to a silicon nitride film (a SiN film) or a silicon borocarbonitride film (a SiBCN film) further including carbon (C) has been studied.

Since a high step coverage characteristic is necessary, the above-described insulating film is frequently formed by an alternate supply method in which a plurality of types of processing gases are alternately supplied. For example, a SiBCN film may be formed on a substrate by performing a cycle a predetermined number of times. The cycle includes sequential supply of processing gases to the substrate, using a silicon-containing gas as a silicon (Si) source, a boron-containing gas as a B source, a carbon-containing gas as a C source and a nitrogen-containing gas as a nitrogen (N) source. However, in the above method in which the Si source, the B source, the C source and N source are separately supplied, a time required for one cycle increases, which results in a decrease of productivity in a film-forming process.

SUMMARY

The present invention is provided to form a thin film having a high resistance to HF and a low dielectric constant with high productivity.

According to an embodiment of the present invention, there is provided a method of manufacturing a semiconductor device, including performing a cycle a predetermined number of times, the cycle including: (a) supplying a source gas containing a predetermined element, carbon and a halogen element and having a chemical bond between the predetermined element and carbon to a substrate; and (b) supplying a reactive gas including a borazine compound to the substrate, wherein the cycle is performed under a condition where a borazine ring structure in the borazine compound and at least a portion of the chemical bond between the predetermined element and carbon in the source gas are preserved to form a thin film including the borazine ring structure and the chemical bond between the predetermined element and carbon on the substrate.

BRIEF DESCRIPTION OF THE DRAWINGS

FIG. 5A illustrates an exemplary sequence in which film-forming is performed in a non-plasma state, and FIG. 5B is a diagram illustrating an exemplary sequence in which film-forming is performed using plasma.

FIG. 6A illustrates an exemplary sequence in which film-forming is performed in a non-plasma state, and FIG. 6B is a diagram illustrating an exemplary sequence in which film-forming is performed using plasma.

DETAILED DESCRIPTION

Embodiment of the Present Invention

Hereinafter, an embodiment of the present invention will be described with reference to FIGS. 1 to 3.

(1) Configuration of Substrate Processing Apparatus

Figure 1:
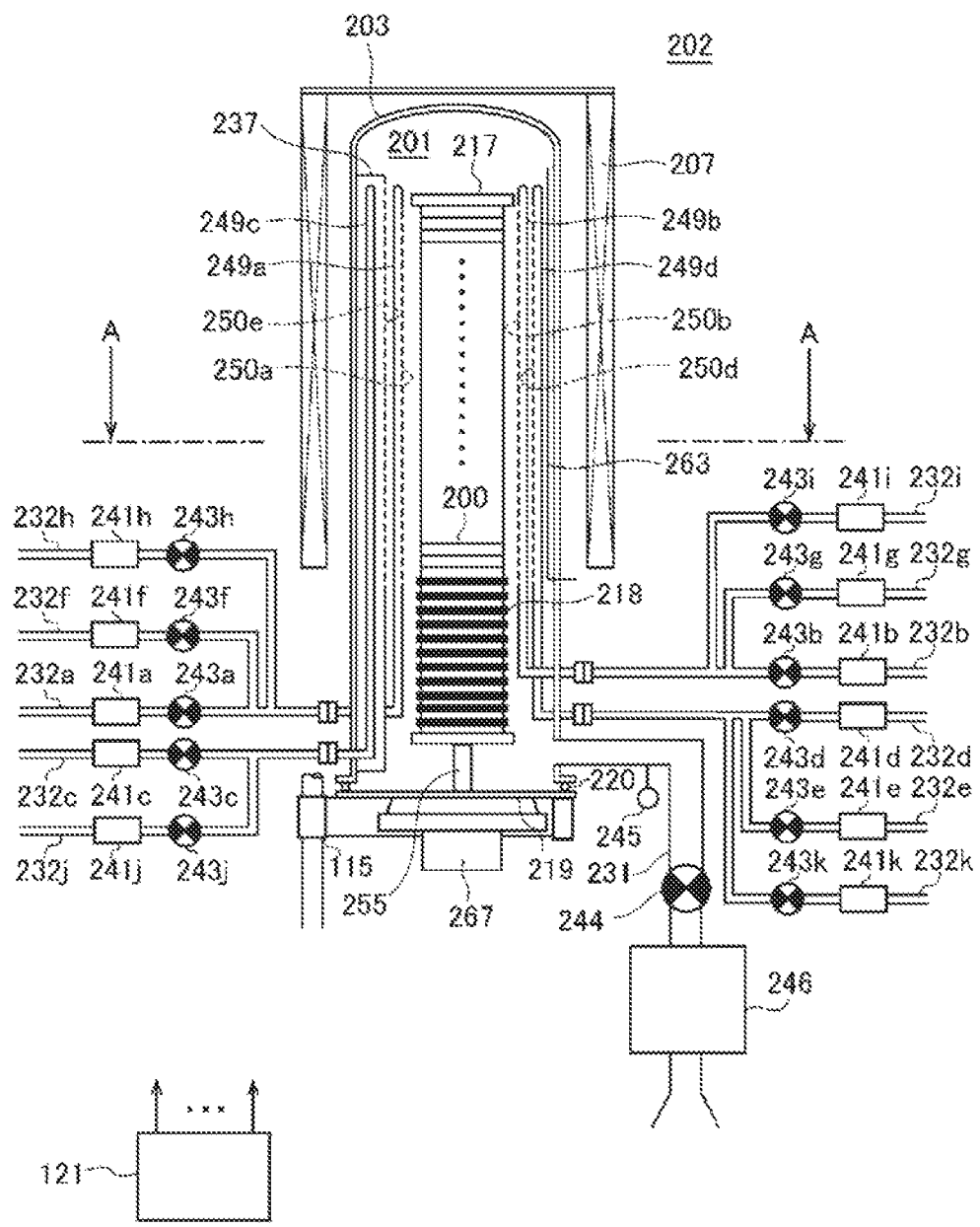
FIG. 1 is a diagram illustrating a schematic configuration of a vertical processing furnace of a substrate processing apparatus that is preferably used in an embodiment of the present invention and is a vertical cross-sectional view illustrating a processing furnace part.

As illustrated in FIG. 1, a processing furnace 202 includes a heater 207 serving as a heating unit (heating mechanism). The heater 207 has a cylindrical shape and is vertically installed by being supported by a heater base (not illustrated) serving as a holding plate. As will be described below, the heater 207 also serves as an activating device (exciting unit) for activating (exciting) a gas by heat.

In the heater 207, a reaction tube 203 forming a reaction container (process container) is concentrically provided with respect to the heater 207. The reaction tube 203 is made of a heat-resistant material such as quartz ($SiO2$) or silicon carbide (SiC), and is formed in a cylindrical shape whose upper end is closed and lower end is opened. A process chamber 201 is formed in a cylindrical hollow portion of the reaction tube 203. The process chamber 201 is configured such that wafers 200 may be accommodated as substrates in a horizontal posture to be arranged on multiple stages in a vertical direction by a boat 217 to be described below.

Nozzles 249a to 249d are provided in the process chamber 201 to penetrate a lower part of the reaction tube 203. Gas supply pipes 232a to 232d are connected to the nozzles 249a to 249d, respectively. A gas supply pipe 232f is connected to the gas supply pipe 232a, a gas supply pipe 232g is connected to the gas supply pipe 232b, and a gas supply pipe 232e is connected to the gas supply pipe 232d. In this manner, the four nozzles 249a to 249d and the seven gas supply pipes 232a to 232g are provided in the reaction tube 203 so that a plurality of types of gases (seven types of gases in this embodiment) may be supplied into the process chamber 201.

However, the processing furnace 202 according to this embodiment is not limited to the above-described form. For example, a manifold made of a metal may be provided below the reaction tube 203 to support the reaction tube 203, and each nozzle may be provided to penetrate sidewalls of the manifold. In this case, an exhaust pipe 231 (to be described below) may be further provided in the manifold. In this case, the exhaust pipe 231 may also be provided below the reaction tube 203 rather than in the manifold. In this way, a furnace port portion of the processing furnace 202 may be made of a metal, and the nozzle and the like may be provided at the furnace port portion made of a metal.

In the gas supply pipes 232a to 232g, in order from an upstream end, mass flow controllers (MFCs) 241a to 241g serving as flow rate controllers (flow rate control units), and valves 243a to 243g serving as on-off valves are provided. Gas supply pipes 232h to 232k configured to supply an inert gas are respectively connected downstream from the valves 243a to 243d of the gas supply pipes 232a to 232d. In the gas supply pipes 232h to 232k, in order from an upstream end, MFCs 241h to 241k serving as flow rate controllers (flow rate control units) and valves 243h to 243k serving as on-off valves are provided.

The nozzles 249a, 249b and 249d are connected to leading ends of the gas supply pipes 232a, 232b and 232d. As illustrated in FIG. 2, the nozzles 249a, 249b and 249d are provided in a cylindrically-shaped space between an inner wall of the reaction tube 203 and the wafer 200, from a lower inner wall to an upper inner wall of the reaction tube 203, so as to rise in a direction in which the wafers 200 are stacked. In other words, the nozzles 249a, 249b and 249d are provided along a wafer arrangement region in which the wafers 200 are arranged, in a region that horizontally surrounds the wafer arrangement region at sides of the wafer arrangement region. The nozzles 249a, 249b and 249d are configured as L-shaped long nozzles, and include a horizontal portion provided to penetrate lower sidewalls of the reaction tube 203 and a vertical portion provided to rise at least from one end to the other end of the wafer arrangement region. Gas supply holes 250a, 250b, and 250d configured to supply a reactive gas are provided at side surfaces of the nozzles 249a, 249b, and 249d. The gas supply holes 250a, 250b, and 250d may be opened to the center of the reaction tube 203 to supply a gas to the wafer 200. The plurality of gas supply holes 250a, 250b, and 250d are provided from a lower part to an upper part of the reaction tube 203, and are provided to each have the same opening area at the same opening pitch.

The nozzle 249c is connected to a leading end of the gas supply pipe 232c. The nozzle 249c is provided in a buffer chamber 237 that is a gas dispersion space. The buffer chamber 237 is a cylindrically-shaped space between the inner wall of the reaction tube 203 and the wafer 200 and is provided in a part from the lower inner wall to the upper inner wall of the reaction tube 203 in a direction in which the wafers 200 are stacked. In other words, the buffer chamber 237 is provided along the wafer arrangement region, in a region that horizontally surrounds the wafer arrangement region at sides of the wafer arrangement region. In the buffer chamber 237, gas supply holes 250e configured to supply a gas are provided at an end of a wall adjacent to the wafer 200. The gas supply hole 250e may be opened to the center of the reaction tube 203 to supply a gas to the wafer 200. The plurality of gas supply holes 250e are provided from the lower part to the upper part of the reaction tube 203, and are provided to each have the same opening area at the same opening pitch.

The nozzle 249c is provided at an end opposite to an end at which the gas supply hole 250e of the buffer chamber 237 is provided, from the lower inner wall to the upper inner wall of the reaction tube 203, so as to rise in the direction in which the wafers 200 are stacked. In other words, the nozzle 249c is provided along the wafer arrangement region in which the wafers 200 are arranged, in a region that horizontally surrounds the wafer arrangement region at sides of the wafer arrangement region. The nozzle 249c is configured as the L-shaped long nozzle, and includes a horizontal portion provided to penetrate lower sidewalls of the reaction tube 203 and a vertical portion provided to rise at least from one end to the other end of the wafer arrangement region. A gas supply hole 250c configured to supply a gas is provided at a side surface of the nozzle 249c. The gas supply hole 250c is opened to the center of the buffer chamber 237. Similar to the gas supply hole 250e, the plurality of gas supply holes 250c are provided from the lower part to the upper part of the reaction tube 203. When a difference between pressures in the buffer chamber 237 and the process chamber 201 is small, the plurality of gas supply holes 250e may be formed to each have the same opening area at the same opening pitch from an upstream end (lower part) to a downstream end (upper part). On the other hand, when a difference between pressures in the buffer chamber 237 and the process chamber 201 is large, the opening areas of the gas supply holes 250e may gradually increase from the upstream end to the downstream end or the opening pitch between the gas supply holes 250e may gradually decrease from the upstream end to the downstream end.

By adjusting the opening area or the opening pitch of the gas supply hole 250c from the upstream end to the downstream end as described above, it is possible to spray gases, flow velocities of which are different but flow rates of which are substantially the same, from each of the gas supply holes 250c. Then, when the gases sprayed from each of the plurality of gas supply holes 250c are introduced into the buffer chamber 237, different flow velocities of the gases may be uniformized in the buffer chamber 237. When the gases are sprayed into the buffer chamber 237 from the plurality of gas supply holes 250c, speeds of particles of each gas are reduced in the buffer chamber 237, and then the gases are sprayed into the process chamber 201 through the plurality of gas supply holes 250e. When the gases sprayed into the buffer chamber 237 from each of the plurality of gas supply holes 250c are sprayed into the process chamber 201 through each of the gas supply holes 250e, the gases each have a uniform flow rate and flow velocity.

In this way, in this embodiment, the gas is transferred through a longitudinally extending space having a cylindrical shape defined by the inner wall of the reaction tube 203 and ends of the plurality of stacked wafers 200, that is, through the buffer chamber 237 and the nozzles 249a to 249d disposed in the cylindrically-shaped space. Then, through the gas supply holes 250a to 250e that are opened to the nozzles 249a to 249d and the buffer chamber 237, respectively, the gas is initially sprayed into the reaction tube 203 in the vicinity of the wafer 200. A main flow of the gas in the reaction tube 203 is set to be parallel to a surface of the wafer 200, that is, in a horizontal direction. In such a configuration, it is possible to uniformly supply the gas to each of the wafers 200, thereby uniformizing a film thickness of a thin film to be formed on each of the wafers 200. The gas flowing along a surface of the wafer 200, that is, a residual gas after a reaction, flows toward an exhaust port, that is, toward the exhaust pipe 231 to be described below. However, a flow direction of the residual gas may be appropriately defined by a location of the exhaust port and is not limited to the vertical direction.

Through the gas supply pipe 232a, as a source gas containing a predetermined element, C and a halogen element, and including a chemical bond between the predetermined element and C, for example, an alkylene halosilane source gas which contains Si as a predetermined element, includes an alkylene group and a halogen group, and includes a chemical bond (Si—C bond) between Si and C, or an alkylhalosilane source gas contains Si, an alkyl group and a halogen group, and includes a Si—C bond, is supplied into the process chamber 201 through the MFC 241a, the valve 243a and the nozzle 249a.

Here, the alkylene group is a functional group in which two hydrogen atoms (H) are removed from a saturated hydrocarbon (alkane) chain represented as a general formula CnH2n+2, and is an aggregate of atoms represented as a general formula CnH2n. The alkylene group includes a methylene group, an ethylene group, a propylene group, a butylene group, and the like. Also, the alkyl group is a functional group in which a hydrogen atom is removed from a saturated hydrocarbon chain represented as a general formula CnH2n+2 and is an aggregate of atoms represented as a general formula CnH2n+1. The alkyl group includes a methyl group, an ethyl group, a propyl group, a butyl group, and the like. Also, the halogen group includes a chloro group, a fluoro group, a bromo group, and the like. That is, the halogen group includes a halogen element such as chlorine (Cl), fluorine (F), or bromine (Br).

As the alkylene halosilane source gas, for example, a source gas containing Si, a methylene group (—CH2-) as the alkylene group, and a chloro group (Cl) as the halogen group, that is a chlorosilane source gas containing the methylene group, or a source gas containing Si, an ethylene group (—C2H4-) as the alkylene group and a chloro group (Cl) as the halogen group, that is, a chlorosilane source gas containing the ethylene group, may be used. As the chlorosilane source gas containing the methylene group, for example, methylenebis(trichlorosilane) gas, that is, bis(trichlorosilyl)methane [(SiCl3)2CH2, abbreviated as: BTCSM] gas or the like may be used. As the chlorosilane source gas containing the ethylene group, for example, ethylenebis(trichlorosilane) gas, that is, 1,2-bis(trichlorosilyl)ethane [(SiCl)2C2H4, abbreviated as: BTCSE] gas, or the like may be used.

Figure 13A:
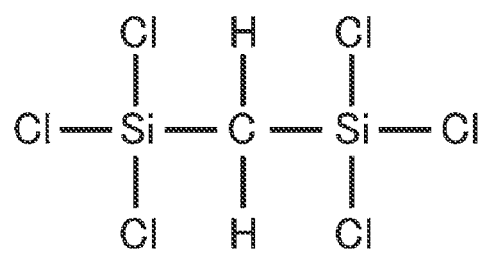
FIG. 13A is a diagram illustrating a chemical structural formula of BTCSM.

As illustrated in FIG. 13A, BTCSM includes one methylene group as the alkylene group in its chemical structural formula (in a molecule). Carbon included in the methylene group combines with two Si atoms and forms a Si—C—Si bond.

Figure 13B:
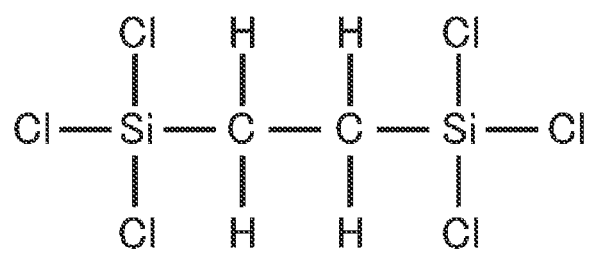
FIG. 13B is a diagram illustrating a chemical structural formula of BTCSE.

As illustrated in FIG. 13B, BTCSE includes one ethylene group as the alkylene group in one molecule. Two carbon atoms included in the ethylene group combine with Si and form a Si—C—C—Si bond.

As the alkylhalosilane source gas, for example, a source gas containing Si, a methyl group (—CH3) as the alkyl group, and a chloro group (Cl) as the halogen group, that is, a chlorosilane source gas containing the methyl group may be used. As the chlorosilane source gas containing the methyl group, for example, 1,1,2,2-tetrachloro-1,2-dimethyldisilane [(CH3)2Si2Cl4, abbreviated as: TCDMDS] gas, 1,2-dichloro-1,1,2,2-tetramethyldisilane [(CH3)4Si2Cl2, abbreviated as: DCTMDS] gas, 1-monochloro-1,1,2,2,2-pentamethyldisilane [(CH3)5Si2Cl, abbreviated as: MCPMDS] gas, or the like may be used. Unlike the alkylene halosilane source gas such as BTCSE gas and BTCSM gas, the alkylhalosilane source gas such as TCDMDS gas, DCTMDS gas and MCPMDS gas is a gas including a Si—Si bond, that is, a source gas containing a predetermined element and a halogen element and including a chemical bond between the predetermined elements.

Figure 13C:
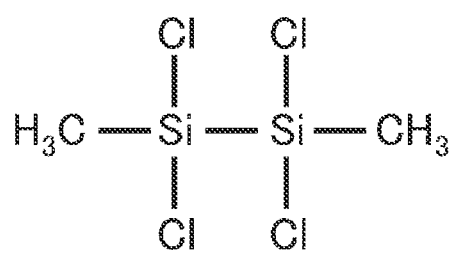
FIG. 13C is a diagram illustrating a chemical structural formula of TCDMDS.

As illustrated in FIG. 13C, TCDMDS includes two methyl groups as the alkyl group in one molecule. Each carbon atom included in the two methyl groups is combined with Si to form a Si—C bond. TCDMDS is a derivative of disilane and includes a Si—Si bond. That is, in TCDMDS, Si and Si are combined with each other, and a Si—Si—C bond in which Si and C are combined is included.

Figure 13D:
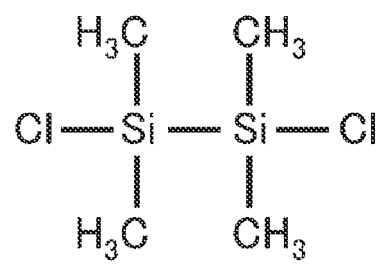
FIG. 13D is a diagram illustrating a chemical structural formula of DCTMDS.

As illustrated in FIG. 13D, DCTMDS includes four methyl groups as the alkyl group in one molecule. Each carbon atom in the four methyl groups is combined with Si to form a Si—C bond. DCTMDS is a derivative of disilane and includes a Si—Si bond. That is, in DCTMDS, Si and Si are combined with each other, and a Si—Si—C bond in which Si and C are combined is included.

Figure 13E:
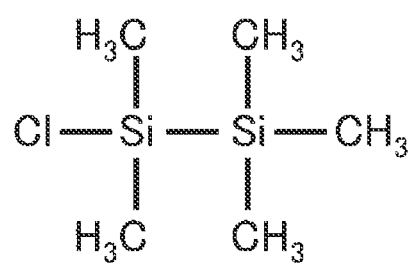
FIG. 13E is a diagram illustrating a chemical structural formula of MCPMDS.

As illustrated in FIG. 13E, MCPMDS includes five methyl groups as the alkyl group in one molecule. Each carbon atom included in the five methyl groups is combined with Si to form a Si—C bond. MCPMDS is a derivative of disilane and includes a Si—Si bond. That is, in MCPMDS, Si and Si are combined with each other, and a Si—Si—C bond in which Si and C are combined is included. Unlike BTCSM, BTCSE, TCDMDS, DCTMDS, and the like, MCPMDS has an asymmetric structure in which the methyl group and the chloro group asymmetrically surround Si in one molecule (in a chemical structural formula). In this manner, in this embodiment, in addition to the source having a symmetric chemical structural formula as illustrated in FIGS. 13A to 13D, a source having an asymmetric chemical structural formula may be used.

The alkylene halosilane source gas such as BTCSM gas or BTCSE gas or the alkylhalosilane source gas such as TCDMDS gas, DCTMDS gas or MCPMDS gas may be a source gas that includes at least two Si atoms in one molecule, contains C and Cl, and includes a Si—C bond. These gases serve as a Si source or a C source in a substrate processing process to be described below. BTCSM gas, BTCSE gas, and the like may also be called an alkylenechlorosilane source gas. TCDMDS gas, DCTMDS gas, MCPMDS gas, and the like may also be called an alkylchlorosilane source gas.

In this specification, the source gas refers to a source in a gas state, for example, a gas that is obtained by vaporizing a source in a liquid state under room temperature and room pressure, a source in a gas state under room temperature and room pressure, and the like. When the term "source" is used in this specification, it may refer to either or both of "a liquid source in a liquid state" or "a source gas in a gas state." When the liquid source in a liquid state under room temperature and room pressure such as BTCSM is used, the liquid source is vaporized by a vaporization system such as a vaporizer or a bubbler and then is supplied as the source gas (such as BTCSM gas).

Through the gas supply pipe 232f, as a source gas that contains a predetermined element and a halogen element and includes a chemical bond between the predetermined elements, for example, a halosilane source gas containing Si as a predetermined element and a halogen element and including a chemical bond (Si—Si bond) between silicon atoms is supplied into the process chamber 201 through the MFC 241f, the valve 243f, the gas supply pipe 232a and the nozzle 249a.

As the halosilane source gas, for example, a source gas containing Si, a chloro group (Cl) as a halogen element and including a Si—Si bond, that is, a chlorosilane source gas may be used. As the chlorosilane source gas, for example, hexachlorodisilane (Si2Cl6, abbreviated as: HCDS) gas may be used. When the liquid source in a liquid state under room temperature and room pressure such as HCDS is used, the liquid source is vaporized by a vaporization system such as a vaporizer or a bubbler and then is supplied as the source gas (HCDS gas).

Through the gas supply pipe 232b, as a reactive gas including a borazine compound, for example, a reactive gas including an alkylborazine compound that is an organic borazine compound, that is, an organic borazine-based gas (borazine-based gas) is supplied into the process chamber 201 through the MFC 241b, the valve 243b and the nozzle 249b.

Figure 14A:
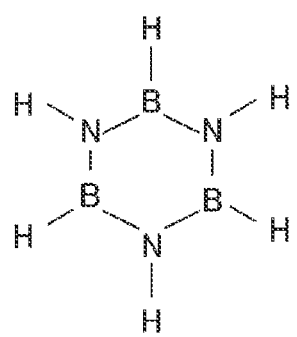
FIG. 14A is a diagram illustrating a chemical structural formula of borazine.
Figure 14B:
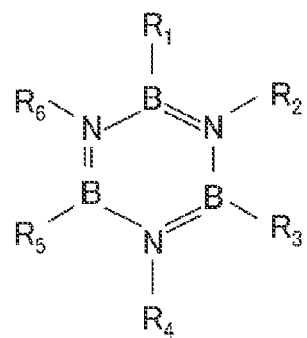
FIG. 14B is a diagram illustrating a chemical structural formula of a borazine compound.

Here, borazine is a heterocyclic compound formed of three elements of B, N and H, may be represented as a composition formula B3H6N3, and may be represented as a chemical structural formula illustrated in FIG. 14A. The borazine compound is a compound including a borazine ring structure (also be called a borazine structure) forming a borazine ring of three B atoms and three N atoms. The organic borazine compound is a borazine compound containing C, and may also be called a borazine compound including a C-containing ligand. The alkylborazine compound is a borazine compound including an alkyl group, and may also be called a borazine compound including the alkyl group as a ligand. In the alkylborazine compound, at least one of six hydrogen atoms included in borazine is replaced by a hydrocarbon containing at least one C atom, and the compound may be represented as a chemical structural formula illustrated in FIG. 14B. Here, in the chemical structural formula illustrated in FIG. 14B, R1 to R6 refer to H or an alkyl group containing one to four C atoms. R1 to R6 may be the same or a different type of the alkyl group, but R1 to R6 may not all be H. The alkylborazine compound may be a material that includes a borazine ring structure forming a borazine ring and contains B, N, H and C. Also, the alkylborazine compound may be a material that includes a borazine ring structure and an alkyl ligand. Also, R1 to R6 may be H or an alkenyl group or an alkynyl group containing one to four carbon atoms. R1 to R6 may be the same or a different type of the alkenyl group or the alkynyl group, but R1 to R6 may not all be H.

A reactive gas including the organic borazine compound such as the alkylborazine compound serves as the B source, the N source, and the C source in the substrate processing process to be described below. The reactive gas including the borazine compound may be simply called a borazine compound gas.

Figure 14C:
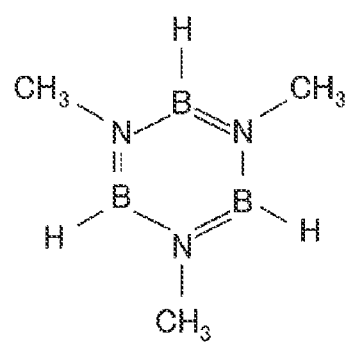
FIG. 14C is a diagram illustrating a chemical structural formula of n, n', n"-trimethlyborazine.
Figure 14D:
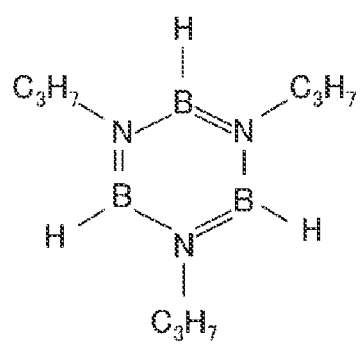
FIG. 14D is a diagram illustrating a chemical structural formula of n, n', n"-tri-n-propylborazine.

As the reactive gas including the borazine compound, for example, n, n', n"-trimethlyborazine (abbreviated as: TMB) gas, n, n', n"-triethylborazine (abbreviated as: TEB) gas, n, n', n"-tri-n-propylborazine (abbreviated as: TPB) gas, n, n', n"-triisopropylborazine (abbreviated as: TIPB) gas, n, n', n"-tri-n-butylborazine (abbreviated as: TBB) gas, n, n', n"-tri-isobutylborazine (abbreviated as: TIBB) gas, or the like may be used. TMB is a borazine compound in which R1, R3 and R5 are H atoms and R2, R4 and R6 are methyl groups in a chemical structural formula illustrated in FIG. 14B and may be represented as a chemical structural formula illustrated in FIG. 14C. TEB is a borazine compound in which R1, R3 and R5 are H atoms and R2, R4 and R6 are ethyl groups in a chemical structural formula illustrated in FIG. 14B. TPB is a borazine compound in which R1, R3 and R5 are H atoms and R2, R4 and R6 are propyl groups in a chemical structural formula illustrated in FIG. 14B and may be represented as a chemical structural formula illustrated in FIG. 14D. TIPB is a borazine compound in which R1, R3 and R5 are H atoms and R2, R4 and R6 are isopropyl groups in a chemical structural formula illustrated in FIG. 14B. TIBB is a borazine compound in which R1, R3 and R5 are H atoms and R2, R4 and R6 are isobutyl groups in a chemical structural formula illustrated in FIG. 14B.

When the borazine compound in a liquid state under room temperature and room pressure such as TMB is used, the borazine compound in a liquid state is vaporized by a vaporization system such as a vaporizer or a bubbler and then is supplied as the reactive gas including the borazine compound (such as TMB gas).

Through the gas supply pipe 232g, as a boron-containing gas, for example, a borane-based gas is supplied into the process chamber 201 through the MFC 241g, the valve 243g, the gas supply pipe 232b and the nozzle 249b.

The borane-based gas refers to a borane compound in a gas state, for example, a gas obtained by vaporizing a borane compound in a liquid state under room temperature and room pressure or a borane compound in a gas state under room temperature and room pressure. The borane compound includes a haloborane compound containing B and a halogen element, for example, a chloroborane compound containing B and Cl as a halogen element. Also, the borane compound includes borane (borohydride) such as monoborane ($BH_3$) or diborane ($B_2H_6$), and a borane compound (borane derivative) in which H of borane is replaced by another element. The borane-based gas serves as the B source in the substrate processing process to be described below. As the borane-based gas, for example, trichloroborane ($BCl_3$) gas may be used. $BCl_3$ gas is a boron-containing gas having no borazine compound, that is, a boron-containing gas without a borazine ring structure, that is, a nonborazine-based boron-containing gas.

Through the gas supply pipe 232c, a nitriding gas (nitrogen-containing gas) is supplied into the process chamber 201 through the MFC 241c, the valve 243c, the nozzle 249c and the buffer chamber 237. The nitriding gas serves as the N source in the substrate processing process to be described below. As the nitriding gas, for example, ammonia ($NH_3$) gas may be used.

Through the gas supply pipe 232d, as a carbon-containing gas, for example, a hydrocarbon gas is supplied into the process chamber 201 through the MFC 241d, the valve 243d and the nozzle 249d. The hydrocarbon gas may be denoted as a material formed of only two elements of C and H, and serves as the C source in the substrate processing process to be described below. As the hydrocarbon gas, for example, propylene ($C_3H_6$) gas may be used.

Through the gas supply pipe 232e, as a gas containing N and C, for example, an amine-based gas is supplied into the process chamber 201 through the MFC 241e, the valve 243e, the gas supply pipe 232d and the nozzle 249d.

The amine-based gas refers to amine in a gas state, for example, a gas that is obtained by vaporizing amine in a liquid state under room temperature and room pressure or a gas including an amine group such as amine in a gas state under room temperature and room pressure. The amine-based gas includes an amine such as ethylamine, methlyamine, propylamine, isopropyl amine, butylamine, and isobutylamine. "Amine" is a general term of a compound in which H of ammonia ($NH_3$) is replaced by a hydrocarbon group such as an alkyl group. An amine includes a hydrocarbon group such as an alkyl group as a ligand containing C. Since the amine-based gas includes three elements of C, N and H without Si, it may be called a Si-free gas. Since the amine-based gas does not include Si and a metal, it may also be called a Si-free and metal-free gas. The amine-based gas serves as the N source and the C source in the substrate processing process to be described below. The amine-based gas may be a material formed of only three elements of C, N and H. When the term "amine" is used in this specification, it may refer to either or both of "amine in a liquid state" and "an amine-based gas in a gas state." As the amine-based gas, for example, triethylamine [$(C_2H_5)_3N$, abbreviated as: TEA] gas that contains three ligands (ethyl groups) containing C in its chemical structural formula (in a molecule) and includes a greater number of C atoms than the number of N atoms in a molecule may be used.

When amine in a liquid state under room temperature and room pressure such as TEA is used, amine in a liquid state is vaporized by a vaporization system such as a vaporizer or a bubbler and then is supplied as a gas containing N and C (TEA gas).

Through the gas supply pipes 232h to 232k, as an inert gas, for example, nitrogen ($N_2$) gas is supplied into the process chamber 201 through the MFCs 241h to 241k, the valves 243h to 243k, the gas supply pipes 232a to 232d, the nozzles 249a to 249d and the buffer chamber 237.

When each gas flows through each gas supply pipe, a first source gas supply system that mainly includes the gas supply pipe 232a, the MFC 241a, and the valve 243a is configured to supply a source gas containing a predetermined element, C and a halogen element and including a chemical bond between the predetermined element and C. The nozzle 249a may be included in the first source gas supply system. The first source gas supply system may also be called a first source supply system. When the alkylene halosilane source gas is supplied through the gas supply pipe 232a, the first source gas supply system may also be called an alkylene halosilane source gas supply system or an alkylene halosilane source supply system. Also, when the alkylhalosilane source gas is supplied through the gas supply pipe 232a, the first source gas supply system may be called an alkylhalosilane source gas supply system or an alkylhalosilane source supply system. Also, the first source gas supply system may be called a source gas supply system or a source supply system.

Also, a second source gas supply system that mainly includes the gas supply pipe 232f, the MFC 241f and the valve 243f is configured to supply a source gas containing a predetermined element and a halogen element and including a chemical bond between the predetermined elements. A downstream side from a unit connecting the gas supply pipe 232f and the gas supply pipe 232a to the nozzle 249a may be included in the second source gas supply system. The second source gas supply system may also be called a second source supply system. When the halosilane source gas such as HCDS gas flows through the gas supply pipe 232f, the second source gas supply system may also be called a halosilane source gas supply system or a halosilane source supply system. Also, the second source gas supply system may be called a source gas supply system or a source supply system. Also, when the alkylhalosilane source gas such as TCDMDS gas flows through the gas supply pipe 232a, since the alkylhalosilane source gas such as TCDMDS gas may be a source gas containing a predetermined element and a halogen element and including a chemical bond between the predetermined elements, the gas supply pipe 232a, the MFC 241a and the valve 243a may be included in the second source gas supply system.

Also, a reactive gas supply system that mainly includes the gas supply pipe 232b, the MFC 241b and the valve 243b is configured to supply the reactive gas including the borazine compound. The nozzle 249b may be included in the reactive gas supply system. The reactive gas supply system may also be called an organic borazine-based gas (borazine-based gas) supply system.

Also, a boron-containing gas supply system that mainly includes the gas supply pipe 232g, the MFC 241g and the valve 243g is configured to supply a boron-containing gas without a borazine ring structure, that is, a nonborazine-based boron-containing gas. A downstream side from a unit connecting the gas supply pipe 232g and the gas supply pipe 232b to the nozzle 249b may be included in the boron-containing gas supply system. When the borane-based gas flows through the gas supply pipe 232g, the boron-containing gas supply system may also be called a borane-based gas supply system or a borane compound supply system.

Also, a nitriding gas supply system that mainly includes the gas supply pipe 232c, the MFC 241c and the valve 243c is configured to supply a nitriding gas. The nozzle 249c and the buffer chamber 237 may be included in the nitriding gas supply system. The nitriding gas supply system may also be called a nitrogen-containing gas supply system or a nitriding agent supply system.

Also, a carbon-containing gas supply system that mainly includes the gas supply pipe 232d, the MFC 241d and the valve 243d is configured to supply a carbon-containing gas. The nozzle 249d may be included in the carbon-containing gas supply system. When a hydrocarbon gas is supplied through the gas supply pipe 232d, the carbon-containing gas supply system may also be called a hydrocarbon gas supply system or a hydrocarbon supply system.

Also, a nitrogen- and carbon-containing gas supply system that mainly includes the gas supply pipe 232e, the MFC 241e and the valve 243e is configured to supply a gas containing N and C. A downstream side from a unit connecting the gas supply pipe 232e and the gas supply pipe 232d to the nozzle 249d may be included in the nitrogen- and carbon-containing gas supply system. When the amine-based gas is supplied through the gas supply pipe 232e, the nitrogen- and carbon-containing gas supply system may also be called an amine-based gas supply system or an amine supply system.

Also, an inert gas supply system mainly includes the gas supply pipes 232h to 232k, the MFCs 241h to 241k and the valves 243h to 243k. The inert gas supply system may also be called a purge gas supply system.

Figure 2:
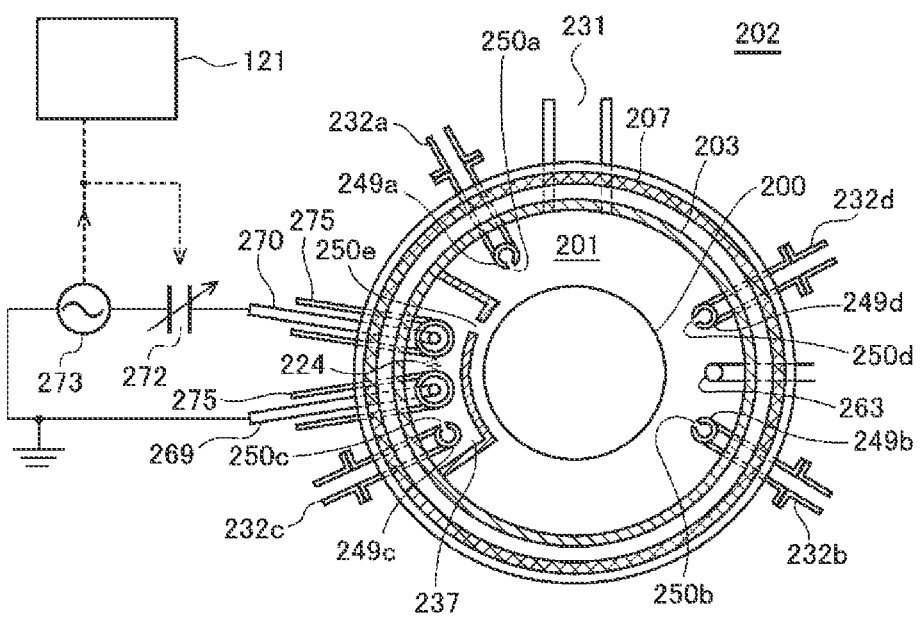
FIG. 2 is a diagram illustrating a schematic configuration of the vertical processing furnace of the substrate processing apparatus that is preferably used in the embodiment of the present invention and is a cross-sectional view illustrating the processing furnace part taken along line A-A in FIG. 1.

As illustrated in FIG. 2, in the buffer chamber 237, two rod-shaped electrodes 269 and 270 made of a conductor and having an elongated structure are provided from the lower part to the upper part of the reaction tube 203 in the direction in which the wafers 200 are stacked. Each of the rod-shaped electrodes 269 and 270 is provided to be parallel to the nozzle 249c. Each of the rod-shaped electrodes 269 and 270 is protected by being covered with an electrode protecting pipe 275 from an upper part to a lower part. One of the rod-shaped electrodes 269 and 270 is connected to a high frequency power source 273 through a matching unit 272, and the other thereof is connected to a ground serving as a reference potential. When high frequency power is applied between the rod-shaped electrodes 269 and 270 from the high frequency power source 273 through the matching unit 272, plasma is generated in a plasma generation region 224 between the rod-shaped electrodes 269 and 270. The rod-shaped electrodes 269 and 270 and the electrode protecting pipe 275 mainly constitute a plasma source serving as a plasma generator (plasma generating unit). The matching unit 272 and the high frequency power source 273 may be included in the plasma source. As will be described below, the plasma source serves as an activating mechanism (exciting unit) for activating a gas to a plasma state.

The electrode protecting pipe 275 has a structure in which each of the rod-shaped electrodes 269 and 270 may be inserted into the buffer chamber 237 while the electrodes are isolated from an atmosphere in the buffer chamber 237. When a concentration of oxygen in the electrode protecting pipe 275 is substantially the same as a concentration of oxygen in the external air (atmosphere), the rod-shaped electrodes 269 and 270 inserted into the electrode protecting pipe 275 are oxidized by heat from the heater 207. When the inert gas such as N2 gas is filled in the electrode protecting pipe 275, or when an inside of the electrode protecting pipe 275 is purged with the inert gas such as N2 gas using an inert gas purge mechanism, a concentration of oxygen in the electrode protecting pipe 275 decreases, thereby preventing the rod-shaped electrodes 269 and 270 from being oxidized.

The exhaust pipe 231 configured to exhaust an atmosphere in the process chamber 201 is provided in the reaction tube 203. In the exhaust pipe 231, a vacuum pump 246 serving as a vacuum exhaust device is connected to a pressure sensor 245 serving as a pressure detector (pressure detecting unit) configured to detect a pressure in the process chamber 201 through an auto pressure controller (APC) valve 244 serving as a pressure regulator (pressure regulating unit). The APC valve 244 is a valve that may perform vacuum-exhaust and vacuum-exhaust stop processes in the process chamber 201 by opening or closing the valve while the vacuum pump 246 is operated, and regulate a pressure in the process chamber 201 by adjusting a degree of valve opening based on information on pressure detected by the pressure sensor 245 while the vacuum pump 246 is operated. The exhaust pipe 231, the APC valve 244, and the pressure sensor 245 mainly constitute an exhaust system. The vacuum pump 246 may be included in the exhaust system.

Below the reaction tube 203, a seal cap 219 capable of hermitically sealing a lower opening of the reaction tube 203 is provided as a furnace port cover. The seal cap 219 is configured to abut a lower end of the reaction tube 203 in a vertical direction from a lower part thereof. The seal cap 219 is made of a metal such as stainless steel and has a disk shape. An 0 ring 220 is provided as a seal member that abuts the lower end of the reaction tube 203 on an upper surface of the seal cap 219. A rotating mechanism 267 configured to rotate the boat 217, to be described below, is provided at a side of the seal cap 219 opposite to the process chamber 201. A rotary shaft 255 of the rotating mechanism 267 penetrates the seal cap 219 and is connected to the boat 217. The rotating mechanism 267 is configured to rotate the wafer 200 by rotating the boat 217. The seal cap 219 is configured to be vertically moved upward and downward by a boat elevator 115 serving as a lifting mechanism that is vertically provided at the outside of the reaction tube 203. The boat elevator 115 is configured to load or unload the boat 217 into or from the process chamber 201 by moving the seal cap 219 upward and downward. The boat elevator 115 is configured as a transfer device (transfer mechanism) that transfers the boat 217, that is, the wafer 200, into or out of the process chamber 201.

The boat 217 serving as a substrate support is configured to support the plurality of wafers 200 on multiple stages, for example, 25 to 200 wafers, that are vertically arranged in a horizontal posture while centers thereof are aligned, that is, to support the wafers arranged at intervals. The boat 217 is made of a heat-resistant material such as quartz or SiC. Below the boat 217, an insulation plate 218 made of a heat-resistant material such as quartz or SiC is supported in a horizontal posture on multiple stages. According to such a configuration, heat from the heater 207 is not easily transferred to the seal cap 219 side. However, this embodiment is not limited thereto. For example, the insulation plate 218 may not be provided below the boat 217, but an insulation tube configured as a tubular member made of a heat-resistant material such as quartz or SiC may be provided.

A temperature sensor 263 serving as a temperature detector is provided in the reaction tube 203. By regulating power supply to the heater 207 based on information on the temperature detected by the temperature sensor 263, the temperature in the process chamber 201 is set to have a desired temperature distribution. Similar to the nozzles 249a to 249d, the temperature sensor 263 is configured in an L shape, and is provided along the inner wall of the reaction tube 203.

Figure 3:
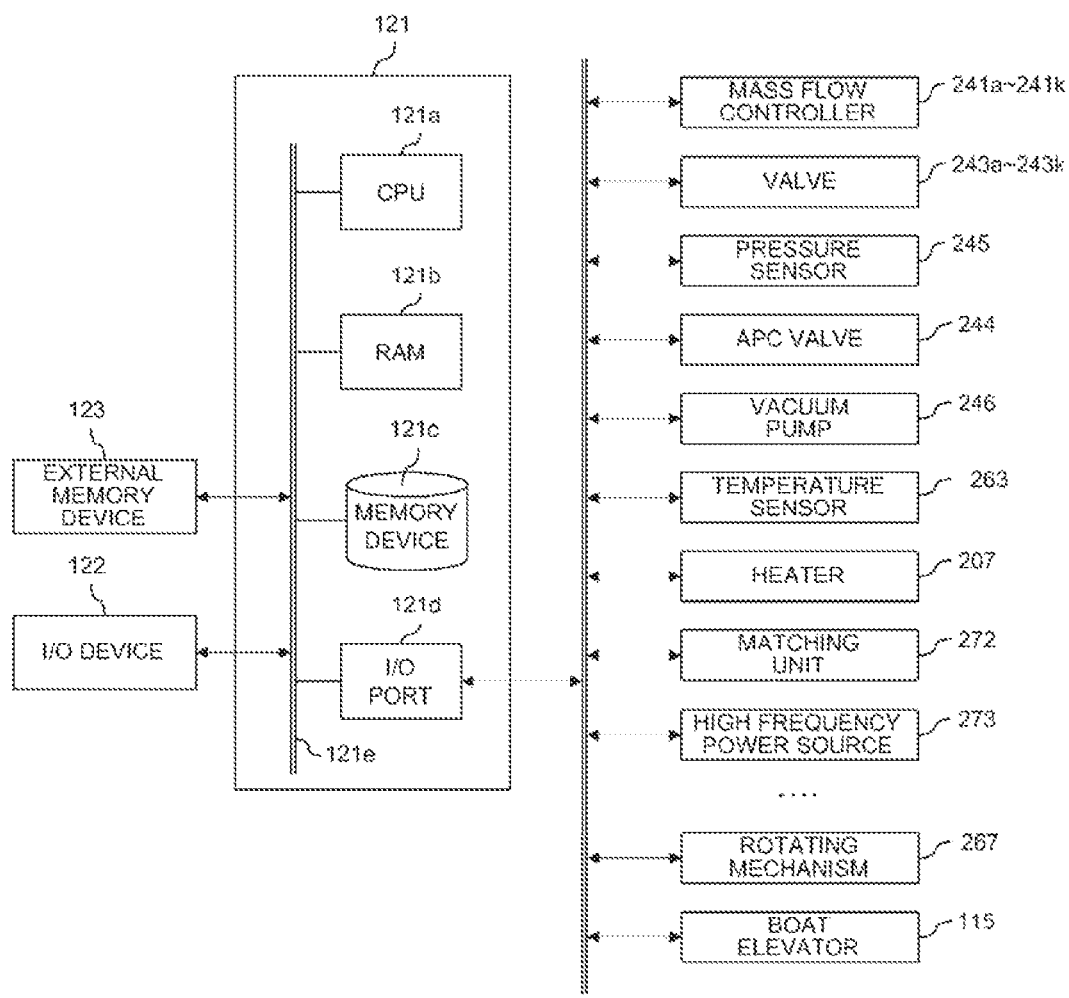
FIG. 3 is a diagram illustrating a schematic configuration of a controller of the substrate processing apparatus that is preferably used in the embodiment of the present invention and is a block diagram illustrating a control system of the controller.

As illustrated in FIG. 3, a controller 121 serving as a control unit (control device) is configured as a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122 configured as, for example, a touch panel, is connected to the controller 121.

The memory device 121c is configured as, for example, a flash memory, and a hard disk drive (HDD). A control program controlling operations of the substrate processing apparatus, a process recipe describing sequences or conditions of substrate processing (to be described below), and the like are readably stored in the memory device 121c. The process recipe, which is a combination of sequences, causes the controller 121 to execute each sequence in a substrate processing process to be described below in order to obtain a predetermined result, and functions as a program. Hereinafter, such a process recipe, a control program, and the like are collectively simply called a "program." When the term "program" is used in this specification, it may refer to either or both of the process recipe and the control program. The RAM 121b is configured as a memory area (work area) in which a program, data, and the like read by the CPU 121a are temporarily stored.

The I/O port 121d is connected to the MFCs 241a to 241k, the valves 243a to 243k, the pressure sensor 245, the APC valve 244, the vacuum pump 246, the heater 207, the temperature sensor 263, the high frequency power source 273, the matching unit 272, the rotating mechanism 267, the boat elevator 115, and the like.

The CPU 121a reads and executes the control program from the memory device 121c and reads the process recipe from the memory device 121c according to an input of a manipulating command from the I/O device 122. To comply with the content of the read process recipe, the CPU 121a is configured to control a flow rate regulating operation of various gases by the MFCs 241a to 241k, an on-off operation of the valves 243a to 243k, an on-off operation of the APC valve 244, a pressure regulating operation by the APC valve 244 based on the pressure sensor 245, starting and stopping of the vacuum pump 246, a temperature regulating operation by the heater 207 based on the temperature sensor 263, power supply of the high frequency power source 273, an impedance regulating operation by the matching unit 272, a rotation and rotational speed regulating operation of the boat 217 by the rotating mechanism 267, a lifting operation of the boat 217 by the boat elevator 115, and the like.

The controller 121 is not limited to being configured as a dedicated computer but may be configured as a general-purpose computer. For example, the controller 121 according to this embodiment may be configured by preparing an external memory device 123 [for example, a magnetic tape, a magnetic disk such as a flexible disk and a hard disk, an optical disc such as a compact disc (CD) and a digital video disc (DVD), a magneto-optical disc such as an MO, and a semiconductor memory such as a Universal Serial Bus (USB) memory and a memory card] recording the above program, and then installing the program in the general-purpose computer using the external memory device 123. However, a method of supplying the program to the computer is not limited to using the external memory device 123. For example, a communication line such as the Internet or an exclusive line may be used to supply the program without using the external memory device. The memory device 121c or the external memory device 123 is configured as a non-transitory computer-readable recording medium. Hereinafter, these are also collectively simply called a recording medium. When the term "recording medium" is used in this specification, it refers to either or both of the memory device 121c and the external memory device 123.

(2) Substrate Processing Process

As a process among manufacturing processes of a semiconductor apparatus (semiconductor device) using the above-described substrate processing apparatus, an exemplary sequence of forming a thin film on a substrate will be described with reference to FIG. 4A. In the following description, operations of respective units constituting the substrate processing apparatus are controlled by the controller 121.

Figure 4A:
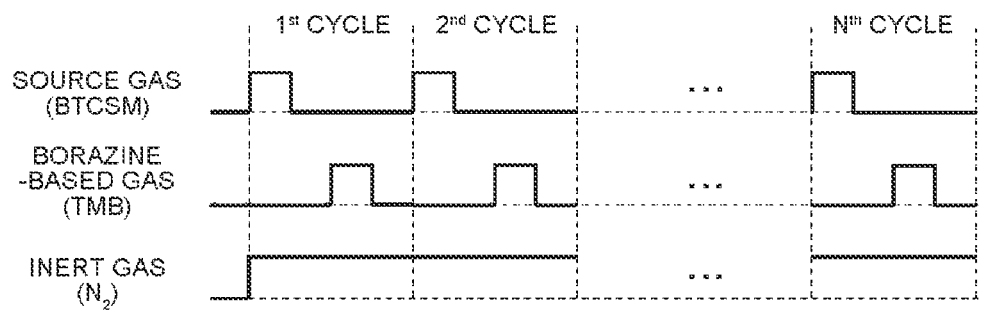
FIG. 4A is a diagram illustrating a gas supply timing in a film-forming sequence of an embodiment of the present invention.

In a film-forming sequence illustrated in FIG. 4A, a silicon borocarbonitride film (SiBCN film) including a borazine ring structure is formed on the wafer 200 as a thin film including a Si—C bond and a borazine ring structure by performing a cycle a predetermined number of times, the cycle including a process of supplying BTCSM gas as a source gas that contains Si, C and Cl and has a Si—C bond to the wafer 200 serving as a substrate; and a process of supplying TMB gas as the reactive gas including the borazine compound to the wafer 200, under conditions in which a borazine ring structure is preserved in the borazine compound and at least some Si—C bonds are preserved in the source gas.

The phrase "a cycle including a process of supplying BTCSM gas and a process of supplying TMB gas is performed a predetermined number of times" means that, when a cycle of performing these processes alternately or simultaneously is set as one cycle, the cycle is performed once or a plurality of times. That is, the cycle is performed at least once. However, it is preferable that the cycle be performed a plurality of times. FIG. 4A illustrates an example in which a process of supplying BTCSM gas and a process of supplying TMB gas are alternately performed a plurality of times.

When the term "wafer" is used in this specification, it refers to "the wafer itself," or a "laminate (aggregate) of a wafer, a predetermined layer, film, and the like formed on a surface thereof," that is, the wafer refers to a wafer including a predetermined layer, film, and the like formed on a surface thereof. In addition, when the term "surface of the wafer" is used in this specification, it refers to "a surface (exposed surface) of the wafer itself" or "a surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film, and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film, and the like formed on the wafer, that is, a predetermined layer (or film) is formed on the outermost surface of the wafer as the laminate."

The terms "substrate" and "wafer" as used in this specification have the same meanings. Thus, the term "wafer" in the above description may be replaced with the term "substrate."

Wafer Charging and Boat Loading

When the plurality of wafers 200 are loaded (wafer charging) on the boat 217, the boat 217 supporting the plurality of wafers 200 is lifted by the boat elevator 115 and is loaded (boat loading) into the process chamber 201, as illustrated in FIG. 1. In this state, the lower end of the reaction tube 203 is sealed by the seal cap 219 through the O ring 220.

Pressure Regulation and Temperature Regulation

Vacuum exhaust is performed by the vacuum pump 246 such that a pressure in the process chamber 201, that is, a pressure in a space in which the wafer 200 is present, has a desired pressure (degree of vacuum). In this case, the pressure in the process chamber 201 is measured by the pressure sensor 245, and the APC valve 244 is feedback-controlled based on information on the measured pressure. The vacuum pump 246 is continuously operated at least until processing on the wafer 200 is completed. In addition, the wafer 200 in the process chamber 201 is heated to a desired temperature by the heater 207. In this case, based on information on the temperature detected by the temperature sensor 263, power supply to the heater 207 is feedback-controlled such that an inside of the process chamber 201 has a desired temperature distribution. The heating of the inside of the process chamber 201 by the heater 207 is continuously performed at least until processing on the wafer 200 is completed. Also, the rotating mechanism 267 begins to rotate the boat 217 and the wafer 200. The rotation of the boat 217 and the wafer 200 by the rotating mechanism 267 is continuously performed at least until processing on the wafer 200 is completed.

SiBCN Film-Forming Process

Then, the following two steps, steps 1 and 2, are sequentially performed.

Step 1—BTCSM Gas Supply

The valve 243a is opened to flow BTCSM gas into the gas supply pipe 232a. BTCSM gas having a flow rate regulated by the MFC 241a is supplied into the process chamber 201 through the gas supply hole 250a and is exhausted through the exhaust pipe 231. At this time, BTCSM gas is supplied to the wafer 200. At the same time, the valve 243h is opened to flow N2 gas into the gas supply pipe 232h. N2 gas having a flow rate regulated by the MFC 241h is supplied into the process chamber 201 along with BTCSM gas and is exhausted through the exhaust pipe 231.

Also, in order to prevent BTCSM gas from being introduced into the nozzles 249b to 249d and the buffer chamber 237, the valves 243i to 243k are opened to flow N2 gas into the gas supply pipes 232i to 232k. N2 gas is supplied into the process chamber 201 through the gas supply pipes 232b to 232d, the nozzles 249b to 249d, and the buffer chamber 237, and is exhausted through the exhaust pipe 231.

At this time, by appropriately adjusting the APC valve 244, a pressure in the process chamber 201 is set to, for example, a range of 1 Pa to 13,300 Pa, and preferably, 133 Pa to 2,666 Pa. A supply flow rate of BTCSM gas controlled by the MFC 241a is set to a flow rate within, for example, a range of 1 sccm to 2,000 sccm, and preferably, 10 sccm to 1,000 sccm. A supply flow rate of N2 gas controlled by the MFCs 241h to 241k is set to a flow rate within, for example, a range of 100 sccm to 10,000 sccm. A time for which BTCSM gas is supplied to the wafer 200, that is, a gas supply time [radiation time], is set to, for example, a range of 1 to 120 seconds, and preferably, a range of 1 to 60 seconds. A temperature of the heater 207 is set such that a temperature of the wafer 200 falls within, for example, a range of 400° C. or more to 800° C. or less, preferably 500° C. or more to 700° C. or less, and more preferably, 600° C. or more to 700° C. or less.

When a temperature of the wafer 200 is less than 400° C., since it is difficult for BTCSM to be chemically adsorbed onto the wafer 200, a practical film-forming rate may not be obtained. When the temperature of the wafer 200 is set to 400° C. or more, it is possible to address this problem. When the temperature of the wafer 200 is set to 500° C. or more, it is possible for BTCSM to be sufficiently adsorbed onto the wafer 200, thereby obtaining a sufficient film-forming rate. When the temperature of the wafer 200 is set to 600° C. or more and 650° C. or more, it is possible for BTCSM to be more sufficiently adsorbed onto the wafer 200, thereby obtaining a more sufficient film-forming rate.

When the temperature of the wafer 200 is greater than 800° C., a CVD reaction becomes strong [a gas-phase reaction is dominant], film thickness uniformity is likely to be degraded, and control thereof may be difficult. When the temperature of the wafer 200 is set to 800° C. or less, it is possible to prevent degradation of film thickness uniformity and thus control thereof is possible. In particular, when the temperature of the wafer 200 is set to 700° C. or less, a surface reaction becomes dominant, film thickness uniformity is easily secured and control thereof becomes easy.

Therefore, the temperature of the wafer 200 may be set to a range of 400° C. or more to 800° C. or less, preferably 500° C. or more to 700° C. or less, and more preferably, 600° C. or more to 700° C. or less. Since BTCSM gas has low degradability (low reactivity) and a high pyrolysis temperature, even when film-forming is performed in a relatively high temperature range, for example, 650° C. to 800° C., it is possible suppress occurrence of an excessive gas-phase reaction and suppress occurrence of resulting particles.

When BTCSM gas is supplied to the wafer 200 under the above-described conditions, a silicon-containing layer that contains C and Cl and has a thickness of, for example, about less than one atomic layer to several atomic layers, is formed on the wafer 200 [a base film of the surface] as a first layer. The silicon-containing layer containing C and Cl becomes a layer having a Si—C bond. The silicon-containing layer containing C and Cl may include either or both of a Si layer containing C and Cl and an adsorption layer of BTCSM gas.

The Si layer containing C and Cl generally refers to a continuous layer that is formed of Si and contains C and Cl, a discontinuous layer, or a Si thin film that is formed by overlapping these layers and contains C and Cl. The continuous layer formed of Si and containing C and Cl may also be called a Si thin film containing C and Cl. Si forming the Si layer containing C and Cl includes Si in which a bond with C or Cl is not completely broken and Si in which a bond with C or Cl is completely broken.

The adsorption layer of BTCSM gas includes an adsorption layer in which gas molecules of BTCSM gas are continuous and an adsorption layer in which gas molecules of BTCSM gas are discontinuous. That is, the adsorption layer of BTCSM gas includes an adsorption layer that is formed of BTCSM molecules and has a thickness of one molecular layer or less than one molecular layer. BTCSM molecules forming the adsorption layer of BTCSM gas include molecules in which a bond between Si and C is partially broken or a bond between Si and Cl is partially broken. That is, the adsorption layer of BTCSM gas may include either or both of a physical adsorption layer of BTCSM gas and a chemical adsorption layer of BTCSM gas.

Here, "layer having a thickness of less than one atomic layer" refers to a discontinuously formed atomic layer. "Layer having a thickness of one atomic layer" refers to a continuously formed atomic layer. "Layer having a thickness of less than one molecular layer" refers to a discontinuously formed molecular layer. "Layer having a thickness of one molecular layer" refers to a continuously formed molecular layer. The silicon-containing layer containing C and Cl may include both the Si layer containing C and Cl and the adsorption layer of BTCSM gas. However, as described above, in the silicon-containing layer containing C and Cl, expressions of "one atomic layer," "several atomic layers," or the like may be used.

Under conditions in which BTCSM gas is self-decomposed (pyrolyzed), that is, conditions causing a pyrolysis reaction of BTCSM gas, when Si is deposited on the wafer 200, the Si layer containing C and Cl is formed. Under conditions in which BTCSM gas is not self-decomposed (pyrolyzed), that is, conditions that do not cause a pyrolysis reaction of BTCSM gas, when BTCSM gas is adsorbed onto the wafer 200, the adsorption layer of BTCSM gas is formed. Under any condition, at least some Si—C bonds are preserved (held) without breaking in BTCSM gas, and directly added into the silicon-containing layer containing C and Cl (the Si layer containing C and Cl or the adsorption layer of BTCSM gas). For example, under conditions in which a pyrolysis reaction of BTCSM gas occurs, when one Si—C bond of a Si—C—Si bond is broken in BTCSM gas, the other Si—C bond is preserved without breaking and directly added into the Si layer containing C and Cl. Forming the adsorption layer of BTCSM gas on the wafer 200 is preferable since a film-forming rate is higher when the Si layer containing C and Cl is formed on the wafer 200 than when the adsorption layer of BTCSM gas is formed on the wafer 200.

When a thickness of the first layer formed on the wafer 200 is more than several atomic layers, a modification action in step 2 to be described does not influence the entire first layer. Also, a minimum thickness of the first layer that may be formed on the wafer 200 is less than one atomic layer. Therefore, the thickness of the first layer is preferably set to a thickness of less than one atomic layer to several atomic layers. When the thickness of the first layer is set to one atomic layer or less, that is, one atomic layer or less than one atomic layer, an effect of a modification reaction in step 2 to be described may relatively increase, and a time required for the modification reaction in step 2 may be reduced. A time required for forming the first layer in step 1 may also decrease. As a result, it is possible to reduce a processing time for performing one cycle, and a total processing time may thus be reduced. That is, it is possible to increase the film-forming rate. In addition, when the thickness of the first layer is set to one atomic layer or less, it is possible to increase controllability of film thickness uniformity.

Residual Gas Removal

After the first layer is formed, the valve 243a is closed to suspend supply of BTCSM gas. At this time, while the APC valve 244 is opened, the inside of the process chamber 201 is vacuum-exhausted by the vacuum pump 246 and an unreacted gas remaining in the process chamber 201 or the BTCSM gas that has contributed to formation of the first layer is removed from the inside of the process chamber 201. At this time, while the valves 243h to 243k are opened, supply of N2 gas into the process chamber 201 continues. N2 gas serves as a purge gas. Accordingly, it is possible to effectively remove the unreacted gas remaining in the process chamber 201 or the BTCSM gas that has contributed to formation of the first layer from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 2 performed thereafter. There is no need to set a flow rate of N2 gas supplied into the process chamber 201 to be high. For example, when the same amount of N2 gas as a volume of the reaction tube 203 [the process chamber 201] is supplied, it is possible to purge to the extent that there is no negative influence on step 2. When the inside of the process chamber 201 is not completely purged in this manner, a purge time decreases, thereby improving throughput. Also, it is possible to suppress unnecessary consumption of N2 gas to a minimum.

As the source gas, in addition to BTCSM gas, for example, BTCSE gas, TCDMDS gas, DCTMDS gas, MCPMDS gas, or the like may be used. As the inert gas, in addition to N2 gas, a rare gas such as Ar gas, He gas, Ne gas, or Xe gas may be used.

Step 2—TMB Gas Supply

After step 1 is completed, the valve 243b is opened to flow TMB gas in the gas supply pipe 232b. TMB gas having a flow rate regulated by the MFC 241b is supplied into the process chamber 201 through the gas supply hole 250b and is exhausted through the exhaust pipe 231. At this time, TMB gas is supplied to the wafer 200. At the same time, the valve 243i is opened to flow N2 gas into the gas supply pipe 232i. N2 gas having a flow rate regulated by the MFC 241i is supplied into the process chamber 201 along with TMB gas and is exhausted through the exhaust pipe 231.

Also, in order to prevent TMB gas from being introduced into the nozzles 249a, 249c and 249d and the buffer chamber 237, the valves 243h, 243j and 243k are opened to flow N2 gas into the gas supply pipes 232h, 232j and 232k. N2 gas is supplied into the process chamber 201 through the gas supply pipes 232a, 232c and 232d, the nozzles 249a, 249c and 249d, and the buffer chamber 237 and is exhausted through the exhaust pipe 231.

At this time, by appropriately adjusting the APC valve 244, a pressure in the process chamber 201 is set to, for example, a range of 1 Pa to 13,300 Pa, and preferably, 500 Pa to 5,000 Pa. A supply flow rate of TMB gas controlled by the MFC 241b is set to a flow rate within, for example, a range of 1 sccm to 1,000 sccm. A supply flow rate of N2 gas controlled by the MFCs 241h to 241k is set to a flow rate within, for example, a range of 100 sccm to 10,000 sccm. A time for which TMB gas is supplied to the wafer 200, that is, a gas supply time (radiation time), is set to, for example, a range of 1 to 120 seconds, and preferably, a range of 1 to 60 seconds. Similar to step 1, a temperature of the heater 207 is set such that a temperature of the wafer 200 falls within, for example, a range of 400° C. or more to 800° C. or less, preferably 500° C. or more to 700° C. or less, and more preferably, 600° C. or more to 700° C. or less.

When TMB gas is supplied to the wafer 200 under the above-described conditions, the first layer formed in step 1 and TMB gas react. That is, Cl (a chloro group) included in the first layer and a ligand (a methyl group) included in TMB may react. Therefore, Cl of the first layer that has reacted with the ligand of TMB may be separated (extracted) from the first layer and the ligand of TMB that has reacted with Cl of the first layer may be separated from TMB. Then, N forming a borazine ring of TMB from which the ligand is separated and Si of the first layer may be combined. That is, it is possible to form a Si—N bond by combining N that has a dangling bond due to a disconnection of a methyl ligand among B and N that form a borazine ring of TMB with Si that has a dangling bond due to inclusion to the first layer or Si having a dangling bond. In this case, a borazine ring structure forming a borazine ring of TMB is preserved without breaking. Also, in this case, at least some Si—C bonds included in the first layer are preserved without breaking.

When TMB gas is supplied under the above-described conditions, since a borazine ring structure of TMB is preserved without breaking, at least some Si—C bonds in the first layer are preserved without breaking, and the first layer and TMB may appropriately react, it is possible to generate the reactions in series. While a borazine ring structure of TMB and the Si—C bond of the first layer are preserved, a temperature of the wafer 200 and a pressure in the process chamber 201, and particularly, the temperature of the wafer 200, is considered as the most important factors (conditions) for generating the reactions in series. When these factors are appropriately controlled, it is possible to generate an appropriate reaction.

According to the reactions in series, a borazine ring is newly added to the first layer, the first layer is changed (modified) to a second layer that includes the Si—C bond and the borazine ring structure and contains Si, B, C and N, that is, a silicon borocarbonitride layer (SiBCN layer) including a Si—C bond and a borazine ring structure. The second layer has a thickness of, for example, about less than one atomic layer to several atomic layers. The SiBCN layer including the borazine ring structure may also be called a layer containing Si, C and a borazine ring structure.

When the borazine ring is newly added to the first layer, a B component and a N component forming the borazine ring are newly added to the first layer. Also, in this case, a C component included in the ligand of TMB is added to the first layer. That is, when a borazine ring is added to the first layer by reacting the first layer with TMB, the C component may be further added to the first layer along with new addition of the B component and the N component.

When the second layer is formed, Cl included in the first layer or H included in TMB gas forms a gaseous substance including at least Cl and H during the modification reaction of the first layer due to TMB gas, and is removed from the inside of the process chamber 201 through the exhaust pipe 231. That is, impurities such as Cl in the first layer are extracted or desorbed from the first layer and thus removed from the first layer. Accordingly, the second layer has lower impurities such as Cl than the first layer.

When the second layer is formed, a borazine ring structure forming a borazine ring included in TMB is preserved without breaking Therefore, since a center space of the borazine ring may be preserved, it is possible to form a porous SiBCN layer.

Residual Gas Removal

After the second layer is formed, the valve 243b is closed to suspend supply of TMB gas. At this time, while the APC valve 244 is opened, the inside of the process chamber 201 is vacuum-exhausted by the vacuum pump 246 and an unreacted gas remaining in the process chamber 201, the TMB gas that has contributed to formation of the second layer, or reaction by-products are removed from the inside of the process chamber 201. At this time, while the valves 243h to 243k are opened, supply of N2 gas into the process chamber 201 continues. N2 gas serves as a purge gas. Accordingly, it is possible to effectively remove the unreacted gas remaining in the process chamber 201, the TMB gas that has contributed to formation of the second layer, or reaction by-products from the inside of the process chamber 201.

At this time, the gas remaining in the process chamber 201 may not be completely removed, and the inside of the process chamber 201 may not be completely purged. When an amount of the gas remaining in the process chamber 201 is small, there is no negative influence on step 1 performed thereafter. There is no need to set a flow rate of N2 gas supplied into the process chamber 201 to be high. For example, when the same amount of N2 gas as a volume of the reaction tube 203 [the process chamber 201] is supplied, it is possible to purge to the extent that there is no negative influence on step 1. When the inside of the process chamber 201 is not completely purged in this manner, a purge time decreases, thereby improving throughput. Also, it is possible to suppress unnecessary consumption of N2 gas to a minimum.

As the reactive gas including the borazine compound, in addition to TMB gas, for example, TEB gas, TPB gas, TIPB gas, TBB gas, or TIBB gas may be used. As the inert gas, in addition to N2 gas, a rare gas such as Ar gas, He gas, Ne gas, or Xe gas may be used.

Performing a Predetermined Number of Times

When a cycle including the above-described steps 1 and 2 is performed once or more (a predetermined number of times), that is, steps 1 and 2 are alternately performed once or more, it is possible to form a SiBCN film including a Si—C bond and a borazine ring structure of a predetermined composition and a predetermined film thickness on the wafer 200. The SiBCN film including a Si—C bond and a borazine ring structure may also be called a thin film including Si, C and a borazine ring structure. It is preferable that the above-described cycle be performed a plurality of times. That is, a thickness of the SiBCN layer to be formed for a cycle is set to be lower than a desired film thickness, and the above-described cycle is preferably performed a plurality of times to obtain the desired film thickness.

At this time, when processing conditions such as a pressure in the process chamber 201 or a gas supply time are controlled in each step, a component of each element in the SiBCN layer, for example, a ratio of a Si component, a B component, a C component or a N component, that is, a Si concentration, a B concentration, a C concentration or a N concentration may be adjusted and a composition ratio of the SiBCN film may be controlled.

When the cycle is performed a plurality of times, if it is described that "a predetermined gas is supplied to the wafer 200" in each step at least after a second cycle, it means that "a predetermined gas is supplied to the layer formed on the wafer 200, that is, to the outermost surface of the wafer 200 as the laminate." When it is described that "a predetermined layer is formed on the wafer 200," it means that "a predetermined layer is formed on the layer formed on the wafer 200, that is, on the outermost surface of the wafer 200 as the laminate." These are the same as the above descriptions and will be the same as in each modification and other embodiments to be described below.

Purging and Restoring to Atmospheric Pressure

The valves 243h to 243k are opened, and N2 gas is supplied into the process chamber 201 through the gas supply pipes 232h to 232k and is exhausted through the exhaust pipe 231. N2 gas serves as a purge gas. Accordingly, the inside of the process chamber 201 is purged and a gas remaining in the process chamber 201 or reaction by-products are removed from the inside of the process chamber 201 (purge). Then, an atmosphere in the process chamber 201 is replaced with an inert gas (inert gas replacement), and a pressure in the process chamber 201 is restored to a room pressure (restoration to atmospheric pressure).

Boat Unloading and Wafer Discharge

The seal cap 219 is moved downward by the boat elevator 115, the lower end of the reaction tube 203 is opened and the processed wafer 200 is unloaded (boat unloading) to the outside of the reaction tube 203 from the lower end of the reaction tube 203 while being held on the boat 217. Then, the processed wafer 200 is extracted by the boat 217 (wafer discharge).

(3) Effects of this Embodiment

According to this embodiment, one or a plurality of effects to be described will be obtained.

(a) When the source gas that contains Si, C and a halogen element and includes a Si—C bond such as BTCSM gas, that is, a gas serving as a C source is used, it is possible to add C to the first layer. Also, when the reactive gas including the borazine compound such as TMB gas, that is, a gas serving as a C source is used, it is possible to further add C to the second layer. As a result, it is possible to increase a C concentration in the SiBCN film to be finally formed. That is, when film-forming is performed using two types of C sources (a double carbon source) for a cycle, it is possible to increase a C concentration in the film, compared to when film-forming is performed using one type of the C source (a single carbon source) for a cycle. Also, accordingly, it is possible to increase a control range of a C concentration in the film of the SiBCN film, that is, a control window of a C concentration. Also, therefore, it is possible to increase HF resistance of the SiBCN film.

Also, when the cycle including steps 1 and 2 is performed under conditions in which at least some Si—C bonds in BTCSM gas are preserved, it is possible to increase a C concentration in the SiBCN film. That is, when step 1 is performed under the above-described conditions, since at least some Si—C bonds in BTCSM gas may be directly added to the first layer, it is possible to increase a C concentration in the first layer. Also, when step 2 is performed under the above-described conditions, since at least some Si—C bonds in the first layer may be directly preserved without breaking, it is possible to prevent C from being desorbed from the first layer, that is, it is possible to prevent a C concentration in the second layer from decreasing. As a result, it is possible to increase a C concentration in the film of the SiBCN film to be finally formed.

In particular, when the source gas having no Si—Si bond and having a Si—C—Si bond including C interposed therebetween such as BTCSM gas is used, it is possible to increase a C concentration in the SiBCN film. C included in the source gas is combined with Si at two positions. Therefore, when the first layer is formed, all bonds between C and Si included in BTCSM gas are broken. Accordingly, it is possible for C to be added to the first layer. Also, when the first layer is modified to the second layer, all bonds between C and Si included in the first layer are broken. Therefore, it is possible to suppress C from being desorbed from the first layer. That is, when the source gas having a Si—C—Si bond such as BTCSM gas is used, it is possible to increase a C concentration in the film, compared to when the source gas that does not include a bond in which C is interposed between Si and Si such as TCDMDS gas is used. Therefore, it is possible to increase HF resistance of the film.

(b) When the source gas containing two Si atoms in a molecule such as BTCSM gas is used, the SiBCN film may become a film in which silicon atoms included in the film are adjacent. When the first layer is formed under conditions in which BTCSM gas is not self-decomposed, two Si atoms included in a BTCSM gas molecule are adsorbed onto the wafer 200 (a base film of the surface) while remaining adjacent to each other. Also, when the first layer is formed under conditions in which BTCSM gas is self-decomposed, two Si atoms included in a BTCSM gas molecule are increasingly likely to be deposited on the wafer 200 while remaining adjacent to each other. That is, when the gas containing two Si atoms in a molecule such as BTCSM gas is used, it is possible to form a state in which silicon atoms included in the first layer are adjacent to each other, compared to when a gas including only one Si in a molecule such as dichlorosilane (SiH2Cl2, abbreviated as: DCS) gas is used. As a result, the SiBCN film may become a film in which silicon atoms in the film are adjacent. Therefore, it is possible to increase HF resistance of the film.

(c) When the borazine-based gas such as TMB gas is used, it is possible to decrease a dielectric constant of the SiBCN film. That is, when the second layer is formed, by preserving a borazine ring structure forming a borazine ring included in TMB without breaking, the SiBCN film may become a porous film. Therefore, since a film density of the SiBCN film may be microscopically decreased, that is, an atomic density in the film may be decreased, it is possible to decrease a dielectric constant of the film. For example, it is possible to form a low dielectric constant film (a low-k film) having a porous structure and an extremely low dielectric constant. Also, when the second layer is formed, for example, if at least a part of a borazine ring structure forming a borazine ring included in TMB is not preserved but broken by increasing a temperature of the wafer 200 or a pressure in the process chamber 201 compared to the above-described process conditions, it is possible to eliminate a center space of the borazine ring. Therefore, since a state (density) of the borazine ring structure in the film, that is, a porous state (density) of the film may be changed, it is possible to finely adjust a dielectric constant of the film. Also, it is possible to control film stress.

(d) When the borazine-based gas such as TMB gas is used, it is possible to increase oxidation resistance of the SiBCN film. Unlike the SiBCN film formed using a nonborazine-based boron-containing gas such as BCl3 gas or diborane (B2H6) gas, the SiBCN film formed using the borazine-based gas includes B as a part of elements of a borazine ring structure forming the film. An annular structure such as the borazine ring structure is chemically stable and is not easily destroyed. That is, a B—N bond forming the borazine ring structure includes a strong bond and is not easily broken. Therefore, the SiBCN film formed using the borazine-based gas becomes a film that has less desorption of B from the film due to oxidation and higher oxidation resistance than the film formed using the nonborazine-based boron-containing gas. For example, the SiBCN film formed using the borazine-based gas becomes a film having high resistance to oxygen plasma and the like, that is, a film having high ashresistance.

(e) When the halosilane source gas containing a plurality of halogen elements (Cl atoms) in a molecule such as BTCSM gas is used, it is possible to efficiently form the first layer. Also, when the organic borazine-based gas having high reducibility and high reactivity with a halogen element, for example, Cl, such as TMB gas is used as the reactive gas, since the first layer and the reactive gas may efficiently react, it is possible to efficiently form the second layer. Therefore, since a film-forming rate of the SiBCN film may be increased, it is possible to increase productivity in the film-forming process.

In particular, when the alkylene halosilane source gas containing a large number of Cl atoms (for example, six) in a molecule such as BTCSM gas is used, it is possible to increase a film-forming rate. Since the alkylene halosilane source gas does not include a Si—Si bond and includes a bond in which C is interposed therebetween, each Si atom of the molecule may be combined with a maximum of three Cl atoms. That is, the alkylene halosilane source gas may include maximum six Cl atoms in a molecule. When the alkylene halosilane source gas containing a large number of Cl atoms in a molecule is used in this manner, a large number of Cl atoms are included in the first layer. As a result, it is possible to efficiently react the first layer with the reactive gas. That is, when the alkylene halosilane source gas such as BTCSM gas is used, it is possible to increase a film-forming rate, compared to when the alkylhalosilane source gas containing a small number of Cl atoms (for example, four or less) in a molecule such as TCDMDS gas is used.

Also, when the alkylene halosilane source gas containing an alkylene group of a small molecular weight (a molecule size) included in a molecule such as BTCSM gas is used, it is possible to increase a film-forming rate and form a strong film. For example, when the alkylene halosilane source gas containing an alkylene group of a large molecular weight such as a hexylene group or a heptylene group in a molecule is used, the alkylene group of a large molecular weight may cause steric hindrance that interferes with a reaction of Si included in the source gas, and therefore formation of the first layer may be interfered with. Also, when the alkylene group is undecomposed or partially decomposed and remains in the first layer, the alkylene group of a large molecular weight causes steric hindrance that interferes with a reaction of Si included in the first layer with TMB gas, and formation of the second layer may be interfered with. On the other hand, when the alkylene halosilane source gas containing an alkylene group of a small molecular weight in a molecule such as BTCSM gas is used, occurrence of the steric hindrance may be suppressed, and formation of the first layer and the second layer may be promoted. As a result, it is possible to increase a film-forming rate and form a strong film. Also, when the alkylhalosilane source gas containing an alkyl group of a small molecular weight in a molecule such as TCDMDS gas is used, the same effects may be obtained.

(f) When Cl included in the first layer and a methyl group included in TMB gas react, since impurities such as Cl may be extracted or desorbed from the first layer, the second layer may become a layer having small impurities. Therefore, by decreasing an impurity concentration in the SiBCN film, it is possible to increase HF resistance of the film.

(g) When the alkylene halosilane source gas serving as the Si source and the C source such as BTCSM gas, and the organic borazine-based gas serving as the B source, the C source and the N source such as TMB gas are used, that is, when two types of gases are used, it is possible to form a film containing four elements of Si, B, C and N. That is, when the film is formed, there is no need to separately supply four types of gases such as the Si source, the B source, the C source and the N source. Therefore, compared to when four types of gases are used, gas supply processes may be decreased by two processes and a time required for one cycle may be decreased. As a result, it is possible to increase productivity in the film-forming process. Also, compared to when four types of gases are used, since gas supply lines may be decreased by two lines, and a structure of the substrate processing apparatus may be simplified, it is possible to decrease a manufacturing cost or a maintenance cost.

(h) When supply of BTCSM gas and supply of TMB gas are alternately performed, these gases may be appropriately reacted under conditions in which a surface reaction is dominant. As a result, it is possible to increase a step coverage characteristic of the SiBCN film and controllability of film thickness control. Also, it is possible to avoid an excessive gas-phase reaction in the process chamber 201 and suppress particles from being generated.

(i) Since BTCSM gas has low degradability (low reactivity) and a high pyrolysis temperature, even when the film is formed in a relatively high temperature range, for example, 650° C. to 800° C., an excessive gas-phase reaction may be suppressed. As a result, since it is possible to suppress particles from being generated in the process chamber 201, a quality of substrate processing may increase.

(j) According to the film-forming sequence of this embodiment in this manner, it is possible to form a film having higher resistance to HF and a lower dielectric constant than a SiCN film or a SiOCN film in the related art on the wafer 200 with high productivity. That is, it is possible to form a thin film capable of achieving an increase in resistance to HF and a decrease in a dielectric constant, which have a trade-off relation, with high productivity.

(4) Modification

The film-forming sequence of this embodiment is not limited to sequences illustrated in FIG. 4A and may be changed to the following modifications.

Modification 1

Figure 4B:
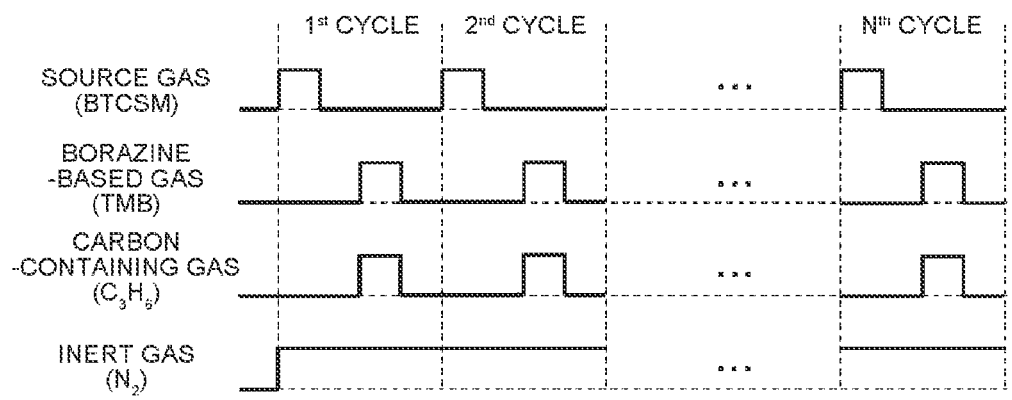
FIGS. 4B and 4C are diagrams illustrating Modification 1.
Figure 4C:
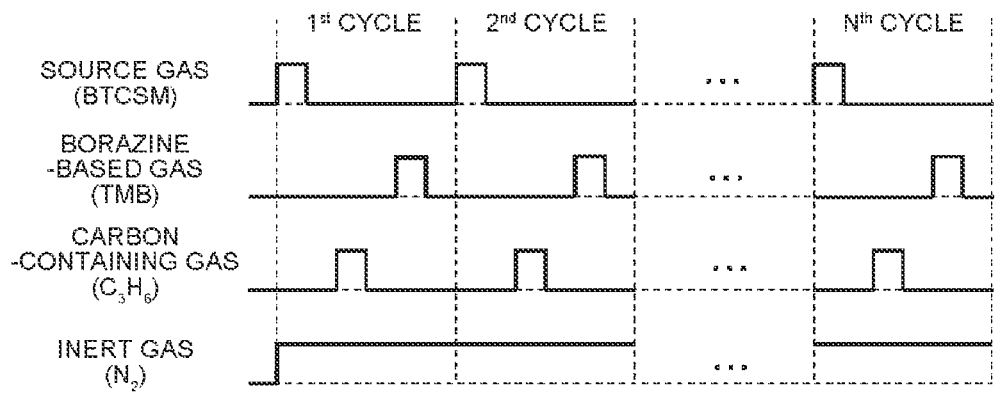

When the above-described cycle is performed a predetermined number of times, a step of supplying a carbon-containing gas, for example, C3H6 gas, to the wafer 200 may be performed at the same timing as in the modifications illustrated in FIGS. 4B and 4C.

In a step of supplying C3H6 gas, on-off control of the valve 243d is performed in the same sequence as on-off control of the valves 243a and 243b in steps 1 and 2. A supply flow rate of C3H6 gas controlled by the MFC 241d is set to a flow rate within, for example, a range of 100 sccm to 10,000 sccm. A pressure in the process chamber 201 is set to, for example, a range of 1 Pa to 6,000 Pa. A partial pressure of C3H6 gas in the process chamber 201 is set to, for example, a range of 0.01 Pa to 5,941 Pa. A time for which C3H6 gas is supplied to the wafer 200, that is, a gas supply time (radiation time) is set to, for example, a range of 1 to 200 seconds, preferably a range of 1 to 120 seconds, and more preferably, a range of 1 to 60 seconds. Other process conditions may be, for example, the same as in step 2 of the film-forming sequence illustrated in FIG. 4A. As the carbon-containing gas, in addition to C3H6 gas, for example, a hydrocarbon-based gas such as acetylene (C2H2) gas or ethylene (C2H4) gas may be used.

According to this modification, the same effects as in the film-forming sequence illustrated in FIG. 4A may be obtained. Also, when the step of supplying C3H6 gas is performed, a C component included in C3H6 gas may be added to the SiBCN film, in addition to the C component included in BTCSM gas or TMB gas. That is, when three types of C sources (a triple carbon source) are used to perform film-forming for a cycle, it is possible to further increase a C concentration in the film compared to the film-forming sequence illustrated in FIG. 4A. Also, when a gas having no N such as C3H6 gas, that is, hydrocarbon gas that does not serve as the N source is used as the carbon-containing gas, it is possible to prevent the N component derived from the carbon-containing gas from being added to the SiBCN film. Therefore, it is possible to suppress a N concentration in the SiBCN film from increasing and increase a C concentration.

Also, in the modification illustrated in FIG. 4B, since the step of supplying C3H6 gas and step 2 are simultaneously performed, a time required for one cycle may be decreased more than in the modification illustrated in FIG. 4C, it is possible to increase productivity in the film-forming process.

Also, since the step of supplying C3H6 gas is independently performed from step 2 in the modification illustrated in FIG. 4C, it is possible to increase controllability of composition ratio control of the SiBCN film, compared to the modification illustrated in FIG. 4B. That is, since supply of C3H6 gas serving as a C source and supply of TMB gas serving as a N source are independently performed such that supply timings do not overlap, it is possible to freely set process conditions of these steps. As a result, while an increase of the N concentration in the SiBCN film is suppressed, it is possible to easily increase the C concentration. However, in order to securely perform a reaction of the first layer with TMB gas, that is, formation of the second layer, supply of TMB gas preferably starts before an adsorption reaction of C3H6 gas molecules saturates the first layer, that is, before an adsorption layer (a chemical adsorption layer) of C3H6 gas formed on the first layer becomes a continuous layer (in a discontinuous layer).

Modification 2

Figure 5A:
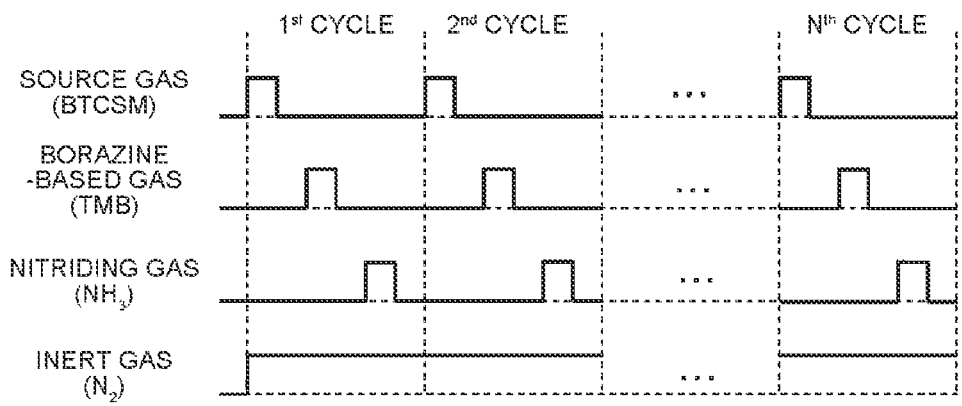
FIGS. 5A and 5B are diagrams illustrating a gas supply and plasma power supply timing in Modification 2.
Figure 5B:
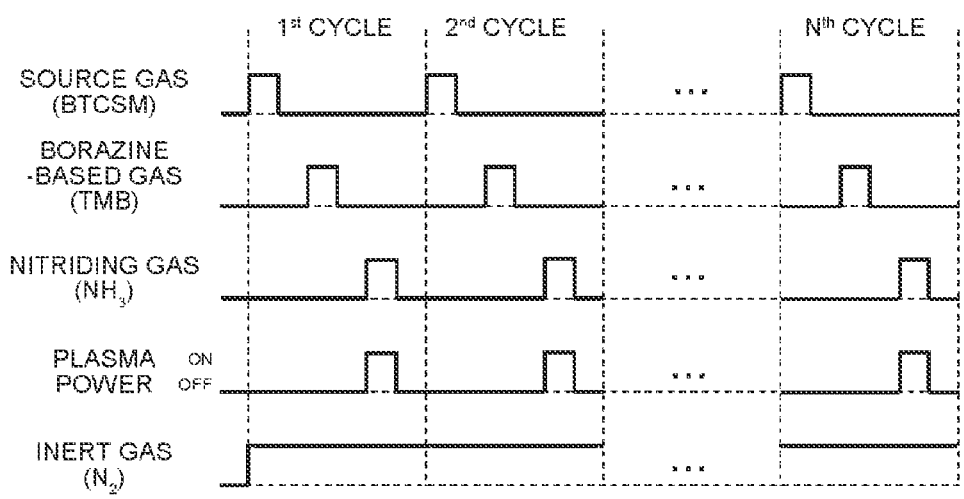
Figure 6A:
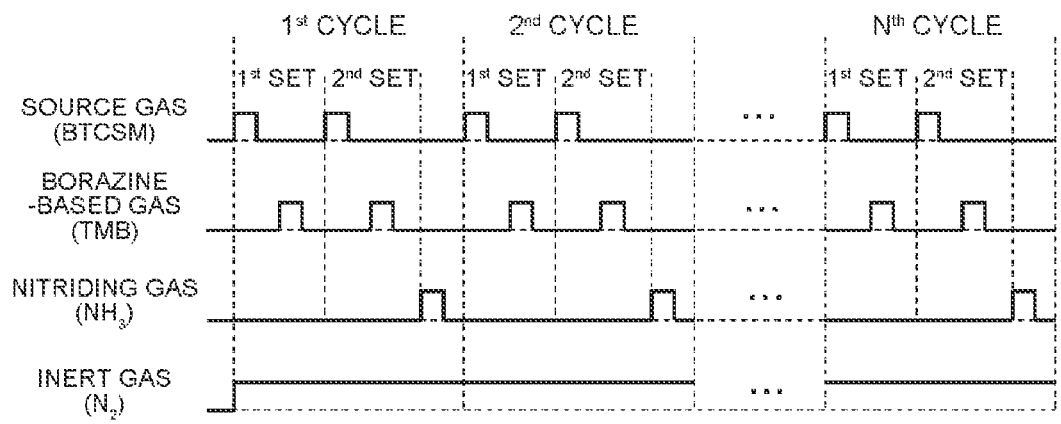
FIGS. 6A and 6B are diagrams illustrating a gas supply and plasma power supply timing in Modification 2.
Figure 6B:
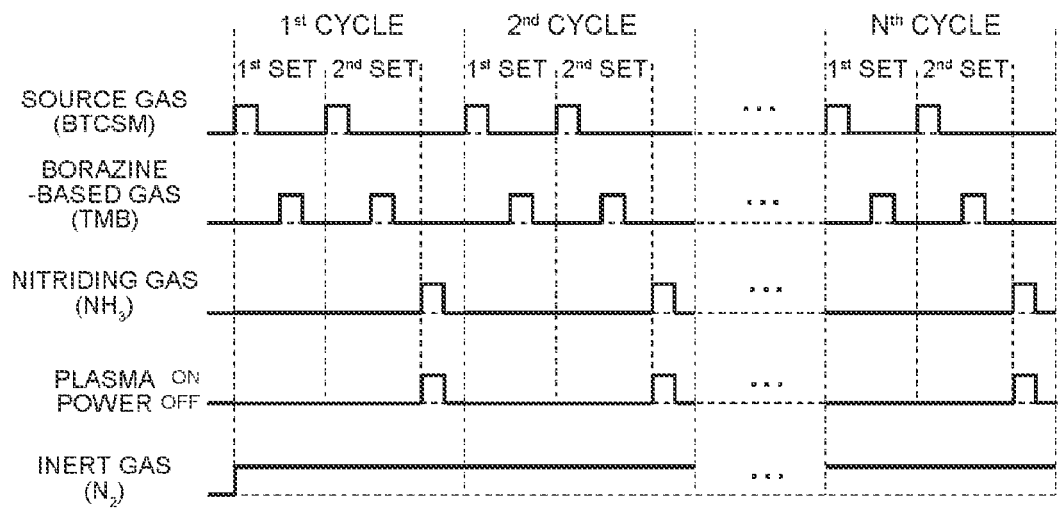
Figure 7A:
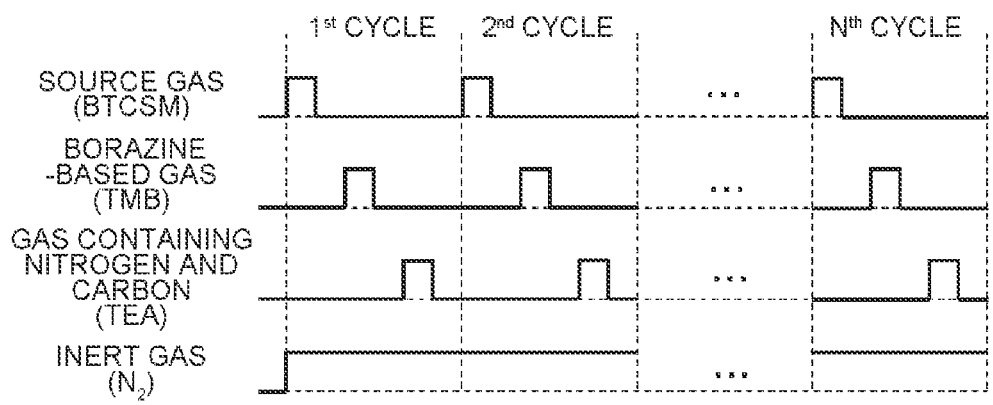
FIGS. 7A and 7B are diagrams illustrating a gas supply timing in Modification 3.
Figure 7B:
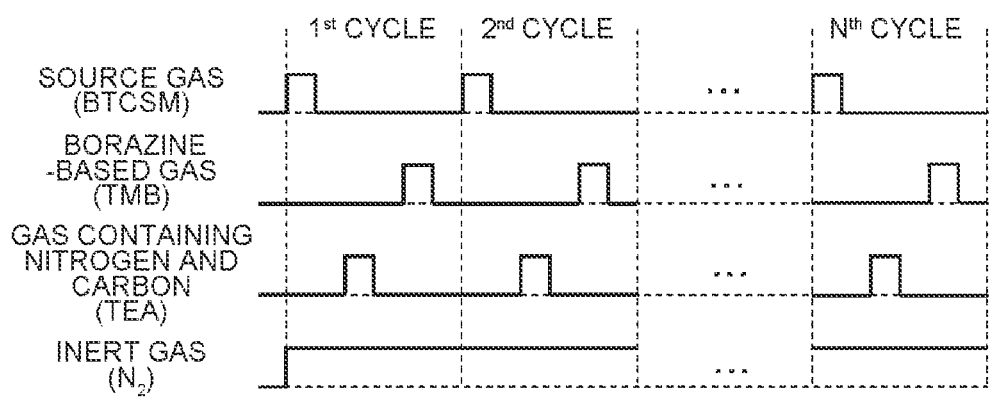

When the above-described cycle is performed a predetermined number of times, a step of supplying NH3 gas activated by heat to the wafer 200 as a nitriding gas may be performed at the same timing as in the modifications illustrated in FIGS. 5A and 6A. Also, a step of supplying NH3 gas activated to plasma to the wafer 200 as a nitriding gas may be performed at the same timing as in the modifications illustrated in FIGS. 5B and 6B. Also, the modifications in FIGS. 6A and 6B illustrate examples in which a cycle is performed a predetermined number of times (n times). The cycle includes a step of performing a set including steps 1 and 2 a predetermined number of times, a plurality of times (twice in FIGS. 6A and 6B) herein, and a step of supplying a nitriding gas to the wafer 200. Also, an example in which the set is performed once corresponds to each modification of FIGS. 5A and 5B.

In the step of supplying NH3 gas activated by heat, on-off control of the valve 243c may be performed in the same sequence as on-off control of the valves 243a and 243b in steps 1 and 2. A supply flow rate of NH3 gas controlled by the MFC 241c is set to a flow rate within, for example, a range of 100 sccm to 10,000 sccm. A pressure in the process chamber 201 is set to, for example, a range of 1 Pa to 3,000 Pa. A partial pressure of NH3 gas in the process chamber 201 is set to, for example, a range of 0.01 Pa to 2,970 Pa. When a pressure in the process chamber 201 is set to a relatively high pressure range in this manner, it is possible to thermally activate NH3 gas to a non-plasma state. When NH3 gas is thermally activated and then supplied, since a relatively soft reaction may be caused, nitration to be described below may be softly performed. A time for which the thermally activated NH3 gas is supplied to the wafer 200, that is, a gas supply time (radiation time) is set to, for example, a range of 1 to 120 seconds, and preferably, a range of 1 to 60 seconds. Other process conditions may be, for example, the same as in step 2 of the film-forming sequence illustrated in FIG. 4A.

In the step of supplying NH3 gas activated to plasma, on-off control of the valve 243c is performed in the same sequence as on-off control of the valves 243a and 243b in steps 1 and 2. A supply flow rate of NH3 gas controlled by the MFC 241c is set to a flow rate within, for example, a range of 100 sccm to 10,000 sccm. High frequency power applied to the rod-shaped electrodes 269 and 270 is set to, for example, a range of 50 W to 1,000 W. A pressure in the process chamber 201 is set to, for example, a range of 1 Pa to 100 Pa. A partial pressure of NH3 gas in the process chamber 201 is set to, for example, a range of 0.01 Pa to 100 Pa. When plasma is used, it is possible to activate NH3 gas even if a pressure in the process chamber 201 is set to a relatively low pressure range in this manner. A time for which active species obtained by exciting NH3 gas to plasma is supplied to the wafer 200, that is, a gas supply time (radiation time) is set to, for example, a range of 1 to 120 seconds, and preferably, a range of 1 to 60 seconds. Other process conditions may be, for example, the same as in step 2 of the film-forming sequence illustrated in FIG. 4A.

As the nitriding gas, in addition to NH3 gas, for example, diazene (N2H2) gas, hydrazine (N2H4) gas, N3H8 gas or a gas including a compound thereof may be used.

When the step of supplying NH3 gas is performed, while a borazine ring structure is not destroyed but preserved in the second layer, the second layer is nitrided and modified (changed) to a N-rich (C-poor) SiBCN layer having a Si—C bond and a borazine ring structure or a SiBN layer having no Si—C bond and including a borazine ring structure. In this case, due to energy of NH3 gas activated by increasing a ratio of the N component in the second layer, at least some of the C component in the second layer is desorbed (extracted), and therefore the second layer is modified to a SiBCN layer or a SiBN layer that is N-rich (C-poor) compared to the second layer. In this case, a Si—N bond in the second layer increases, but a Si—C bond and a Si—Si bond decrease. Therefore, ratios of the C component and the Si component in the second layer decrease. In particular, most of the C component may be desorbed to an impurity level or the C component may be substantially eliminated. That is, while a composition ratio is changed such that the N concentration increases and the C concentration and the Si concentration decrease, the second layer may be modified to the N-rich (C-poor) SiBCN layer or SiBN layer. In this case, by controlling process conditions such as a pressure in the process chamber 201, a gas supply time, and the like, a ratio of the N component in the SiBCN layer or the SiBN layer, that is, the N concentration, may be finely adjusted. Therefore, it is possible to control a composition ratio of the SiBCN layer or the SiBN layer more precisely.

At this time, a nitriding reaction of the second layer is preferred not to saturate. For example, when the second layer having a thickness of less than one atomic layer to several atomic layers is formed in steps 1 and 2, a part of the second layer is preferably nitrided. In this case, nitration is performed under conditions in which a nitriding reaction of the second layer is not saturating. In order to not saturate the second layer with the nitriding reaction, process conditions in the step of supplying NH3 gas may be set as the above-described process conditions. However, when the process conditions are set as the following process conditions, it is easy to not saturate with the nitriding reaction.

When $NH_3$ gas is thermally activated and flows
  Wafer temperature: 500° C. to 650° C.
  Pressure in process chamber: 133 Pa to 2,666 Pa
  $NH_3$ gas partial pressure: 33 Pa to 2,515 Pa
  $NH_3$ gas supply flow rate: 1,000 sccm to 5,000 sccm
  $N_2$ gas supply flow rate: 300 sccm to 3,000 sccm
  $NH_3$ gas supply time: 6 seconds to 60 seconds
When $NH_3$ gas is activated to plasma and flows
  Wafer temperature: 500° C. to 650° C.
  Pressure in process chamber: 33 Pa to 80 Pa
  $NH_3$ gas partial pressure: 17 Pa to 75 Pa
  $NH_3$ gas supply flow rate: 1,000 sccm to 5,000 sccm
  $N_2$ gas supply flow rate: 300 sccm to 1,000 sccm
  $NH_3$ gas supply time: 6 seconds to 60 seconds According to this modification, the same effects as in the film-forming sequence illustrated in FIG. 4A may be obtained. Also, when the step of supplying NH3 gas is performed, that is, when film-forming is performed using two types of N sources (a double nitrogen source) for a cycle, it is possible to increase the N concentration in the film, compared to the film-forming sequence illustrated in FIG. 4A. Therefore, a SiBN film may also be formed in addition to the SiBCN film, and it is possible to control a composition ratio of the SiBCN film or the SiBN film more precisely. Also, impurities such as Cl may be further desorbed (extracted) from the second layer. As a result, since an impurity concentration in the SiBCN film or the SiBN film is further decreased, it is possible to further increase HF resistance of the film.

Modification 3

Figure 8A:
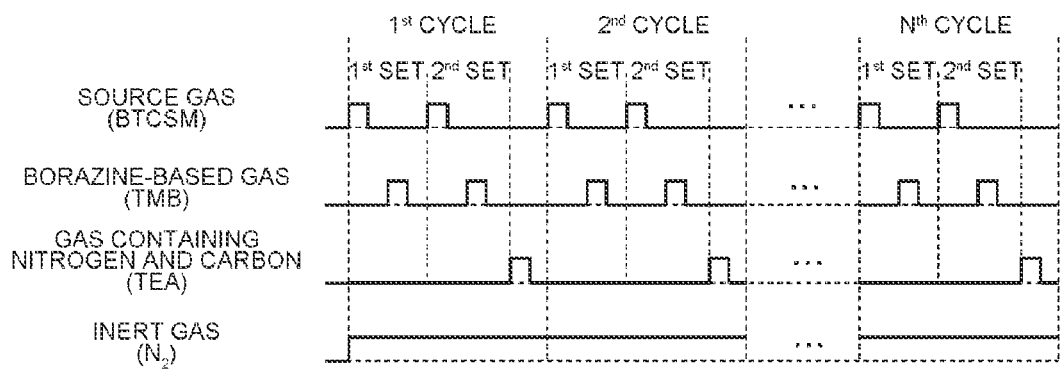
FIGS. 8A and 8B are diagrams illustrating a gas supply timing in Modification 3.
Figure 8B:
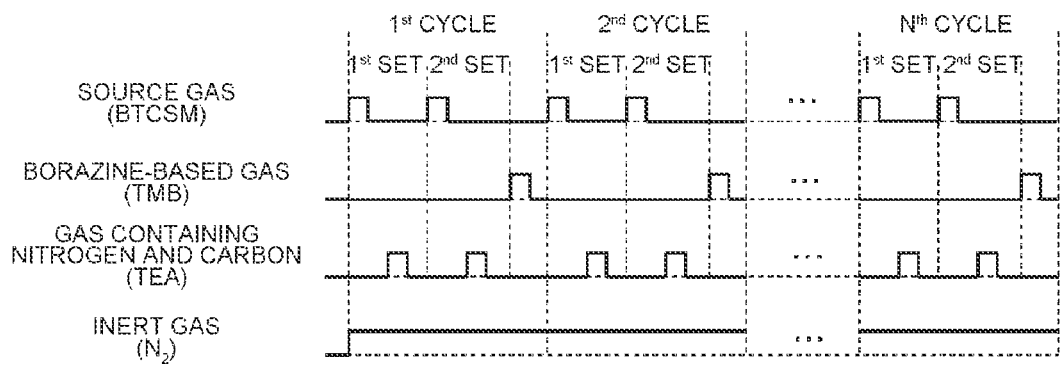

When the above-described cycle is performed a predetermined number of times, a step of supplying TEA gas as a gas containing N and C to the wafer 200 may be performed at the same timing as in the modifications illustrated in FIGS. 7A, 7B, 8A and 8B. Also, the modification in FIG. 8A illustrates an example in which a cycle is performed a predetermined number of times (n times). The cycle includes a step of performing a set including steps 1 and 2 a predetermined number of times, a plurality of times (twice in FIG. 8A) herein, and a step of supplying TEA gas to the wafer 200. Also, an example in which the set is performed once corresponds to the modification of FIG. 7A. Also, the modification in FIG. 8B illustrates an example in which a cycle is performed a predetermined number of times (n times). The cycle includes performing a set including step 1 and a step of supplying TEA gas to the wafer 200 a predetermined number of times, a plurality of times (twice in FIG. 8B) herein, and step 2. Also, an example in which the set is performed once corresponds to the modification of FIG. 7B.

In the step of supplying TEA gas, on-off control of the valve 243e is performed in the same sequence as on-off control of the valves 243a and 243b in steps 1 and 2. A supply flow rate of TEA gas controlled by the MFC 241e is set to a flow rate within, for example, a range of 100 sccm to 10,000 sccm. A pressure in the process chamber 201 is set to, for example, a range of 1 Pa to 6,000 Pa. A partial pressure of TEA gas in the process chamber 201 is set to, for example, a range of 0.01 Pa to 5,941 Pa. A time for which TEA gas is supplied to the wafer 200, that is, a gas supply time (radiation time) is set to, for example, a range of 1 to 200 seconds, preferably a range of 1 to 120 seconds, and more preferably, a range of 1 to 60 seconds. Other process conditions may be, for example, the same as in step 2 of the film-forming sequence illustrated in FIG. 4A.

As the gas containing N and C, in addition to TEA gas, for example, an ethylamine-based gas that is obtained by vaporizing diethylamine [(C2H5)2NH, abbreviated as DEA], monoethylamine (C2H5NH2, abbreviated as MEA), or the like, a methylamine-based gas that is obtained by vaporizing trimethylamine [(CH3)3N, abbreviated as TMA], dimethylamine [(CH3)2NH, abbreviated as DMA], monomethylamine (CH3NH2, abbreviated as MMA), or the like, a propylamine-based gas that is obtained by vaporizing tripropylamine [(C3H7)3N, abbreviated as TPA], dipropylamine [(C3H7)2NH, abbreviated as DPA], monopropylamine (C3H7NH2, abbreviated as MPA), or the like, an isopropylamine-based gas that is obtained by vaporizing triisopropylamine ([(CH3)2CH]3N, abbreviated as TIPA), diisopropylamine ([(CH3)2CH]2NH, abbreviated as DIPA), monoisopropylamine [(CH3)2CHNH2, abbreviated as MIPA], or the like, a butylamine-based gas that is obtained by vaporizing tributylamine [(C4H9)3N, abbreviated as TBA], dibutylamine [(C4H9)2NH, abbreviated as DBA], monobutylamine (C4H9NH2, abbreviated as MBA), or the like, or an isobutylamine-based gas that is obtained by vaporizing triisobutylamine ([(CH3)2CHCH2]3N, abbreviated as TIBA), diisobutylamine ([(CH3)2CHCH2]2NH, abbreviated as DIBA), monoisobutylamine [(CH3)2CHCH2NH2, abbreviated as MIBA], or the like, may be used. That is, as the amine-based gas, for example, at least one type of a gas that is obtained by vaporizing (C2H5)xNH3-x, (CH3)xNH3-x, (C3H7)xNH3-x, [(CH3)2CH]xNH3-x, (C4H9)xNH3-x, or [(CH3)2CHCH2]xNH3-x (in the formula, x is an integer of 1 to 3) may be used. In order to suppress an increase in the N concentration in the SiBCN film and increase the C concentration, a gas including a greater number of C atoms than the number of N atoms in a molecule is preferably used as the amine-based gas. That is, a gas including at least one amine selected from the group consisting of TEA, DEA, MEA, TMA, DMA, TPA, DPA, MPA, TIPA, DIPA, MIPA, TBA, DBA, MBA, TIBA, DIBA and MIBA is preferably used as the amine-based gas.

Also, as the gas containing N and C, in addition to the amine-based gas, for example, a gas including an organic hydrazine compound, that is, an organic hydrazine-based gas may be used. The gas including the organic hydrazine compound may be simply called an organic hydrazine compound gas or an organic hydrazine gas. Here, the organic hydrazine-based gas refers to a gas including a hydrazine group such as an organic hydrazine in a gas state, for example, a gas obtained by vaporizing an organic hydrazine in a liquid state under room temperature and room pressure, or an organic hydrazine in a gas state under room temperature and room pressure. The organic hydrazine-based gas is a Si-free gas formed of three elements of C, N and H or a Si-free and metal-free gas. As the organic hydrazine-based gas, for example, a methylhydrazine-based gas obtained by vaporizing monomethylhydrazine [(CH3)HN2H2, abbreviated as: MMH], dimethylhydrazine [(CH3)2N2H2, abbreviated as: DMH], trimethylhydrazine [(CH3)2N2(CH3)H, abbreviated as: TMH], or the like, or an ethylhydrazine-based gas obtained by vaporizing ethylhydrazine [(C2H5)HN2H2, abbreviated as: EH] or the like may be used. In order to suppress an increase in the N concentration in the SiBCN film and increase the C concentration, a gas including a greater number of C atoms than the number of N atoms in a molecule is preferably used as the organic hydrazine-based gas.

As the amine-based gas or the organic hydrazine-based gas, a gas including a plurality of ligands containing C in a molecule, that is, a gas including a plurality of hydrocarbon groups such as an alkyl group in a molecule is preferably used. Specifically, as the amine-based gas or the organic hydrazine-based gas, a gas including three or two ligands (a hydrocarbon group such as an alkyl group) containing C in a molecule is preferably used.

When the step of supplying TEA gas is performed, while a borazine ring structure is not destroyed but preserved in the second layer and at least some Si—C bonds in the second layer are not destroyed but preserved, it possible to modify the second layer by reacting the second layer with TEA gas. At this time, when the N component and the C component included in TEA gas are added to the second layer, the N component and the C component of the modified second layer increase. When TEA gas is thermally activated and then supplied, it is possible to alleviate a desorption (extraction) action of the C component from the second layer, and easily perform control such that a ratio of the C component in the SiBCN film increases. The most important factors (conditions) for generating this reaction while a borazine ring structure of the second layer and a Si—C bond of the second layer are preserved are considered as a temperature of the wafer 200 and a pressure in the process chamber 201, and particularly, the temperature of the wafer 200. When these factors are appropriately controlled, it is possible to generate an appropriate reaction.

According to this modification, the same effects as in the film-forming sequence illustrated in FIG. 4A may be obtained. Also, when the step of supplying TEA gas is performed, a C component included in TEA gas may be added to the SiBCN film, in addition to the C component included in BTCSM gas or TMB gas. That is, when three types of C sources (a triple carbon source) are used to perform film-forming for a cycle, it is possible to increase a C concentration in the film compared to the film-forming sequence illustrated in FIG. 4A. Also, it is possible to add the N component included in TEA gas to the SiBCN film in addition to the N component included in TMB gas. That is, when film-forming is performed using two types of N sources (a double nitrogen source) for a cycle, it is possible to increase the N concentration in the film, compared to the film-forming sequence illustrated in FIG. 4A. This is the same as in Modification 2. When the step of supplying TEA gas is performed in this manner, it is possible to control a composition ratio of the SiBCN film more precisely.

Modification 4

Figure 9A:
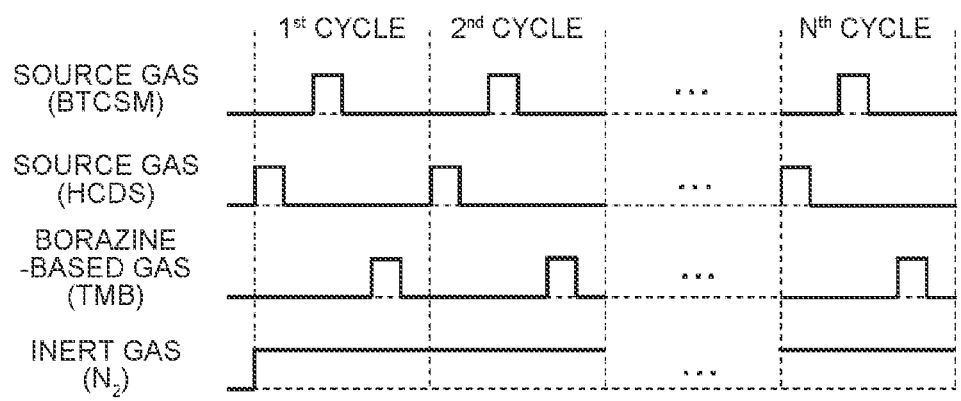
FIGS. 9A and 9B are diagrams illustrating a gas supply timing in Modification 4.
Figure 9B:
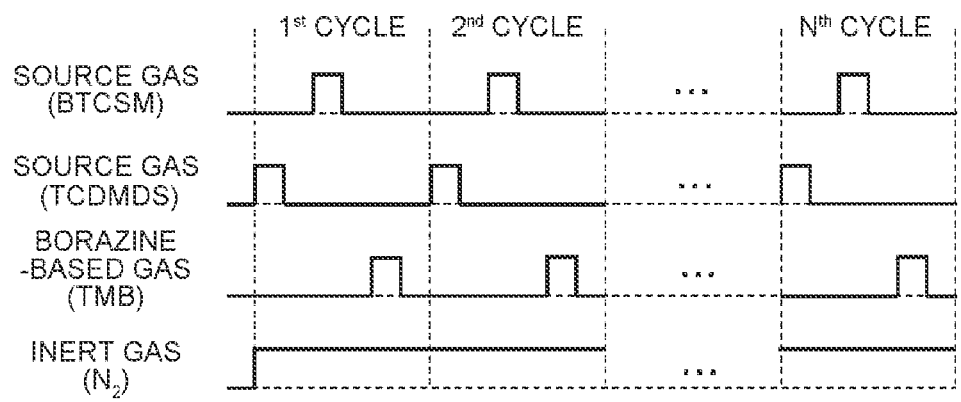

When the above-described cycle is performed a predetermined number of times, a step of supplying a source gas containing Si and a halogen element and including a Si—Si bond, for example, HCDS gas or TCDMDS gas, to the wafer 200 may be performed at the same timing as in the modifications illustrated in FIGS. 9A and 9B.

In the step of supplying HCDS gas or TCDMDS gas, on-off control of the valves 243*f* and 243*a* is performed in the same sequence as on-off control of the valve 243*a* in step 1. A supply flow rate of HCDS gas or TCDMDS gas controlled by the MFCs 241*f* and 241*a* is set to a flow rate within, for example, a range of 100 sccm to 2,000 sccm. A time for which HCDS gas or TCDMDS gas is supplied to the wafer 200, that is, a gas supply time (radiation time) is set to, for example, a range of 1 to 120 seconds, and preferably, a range of 1 to 60 seconds. Other process conditions may be, for example, the same as in step 2 of the film-forming sequence illustrated in FIG. 4A.

As the source gas containing Si and a halogen element and including a Si—Si bond, in addition to HCDS gas and TCDMDS gas, the chlorosilane source gas such as chlorodisilane (ClH5Si2) gas, dimethylchlorodisilane (C2H9ClSi2) gas, chloropentamethyldisilane (C5H15ClSi2) gas, DCTMDS gas, or MCPMDS gas may be used.

Also, as the source gas containing Si and a halogen element and including a Si—Si bond, in addition to the chlorosilane source gas, for example, a silane source gas having a halogen-based ligand other than a chloro group may be used. For example, instead of the chlorosilane source gas, a fluorosilane source gas may be used. The fluorosilane source gas refers to a fluorosilane source in a gas state, for example, a gas that is obtained by vaporizing a fluorosilane source in a liquid state under room temperature and room pressure or a fluorosilane source in a gas state under room temperature and room pressure. The fluorosilane source is a silane source including a fluoro group as a halogen group, is a source including at least Si and F, and serves as the Si source herein. The fluorosilane source may be a type of halide. As the fluorosilane source gas, for example, a silicon fluoride gas such as hexafluorodusilane (Si2F6) gas may be used.

According to this modification, the same effects as in the film-forming sequence illustrated in FIG. 4A may be obtained. Also, the source gas containing Si and a halogen element and including a Si—Si bond such as HCDS gas or TCDMDS gas has higher adsorptivity than the source gas having no Si—Si bond such as BTCSM gas, and may improve adsorptivity of BTCSM gas when supplied before BTCSM gas. That is, before step 1 is performed, when the step of supplying the source gas having higher adsorptivity than BTCSM gas such as HCDS gas or TCDMDS gas is performed, it is possible to form a silicon-containing layer containing Cl also serving as a seed layer (an initial layer) on the wafer 200. As a result, since adsorption of BTCSM gas may be promoted by the seed layer, it is possible to promote formation of the first layer. Therefore, it is possible to increase a film-forming rate of the SiBCN film. Also, since adsorption of BTCSM gas may be promoted, it is possible to reduce a consumption amount of the source gas that does not contribute to film-forming and reduce a film-forming cost. Also, when the silicon-containing layer containing Cl that also serves as the seed layer is formed, it is possible to suppress the first layer from growing in an island shape. As a result, it is possible to improve a step coverage characteristic of the SiBCN film or wafer in-plane film thickness uniformity.

Also, in the modification illustrated in FIG. 9B, when the step of supplying TCDMDS gas that also serves as the C source is performed, it is possible to add a C component included in TCDMDS to the SiBCN film in addition to the C component included in BTCSM gas or TMB gas. That is, when three types of C sources (a triple carbon source) are used to perform film-forming for a cycle, it is possible to increase a C concentration in the film compared to the film-forming sequence illustrated in FIG. 4A or 9A.

Modification 5

Figure 10A:
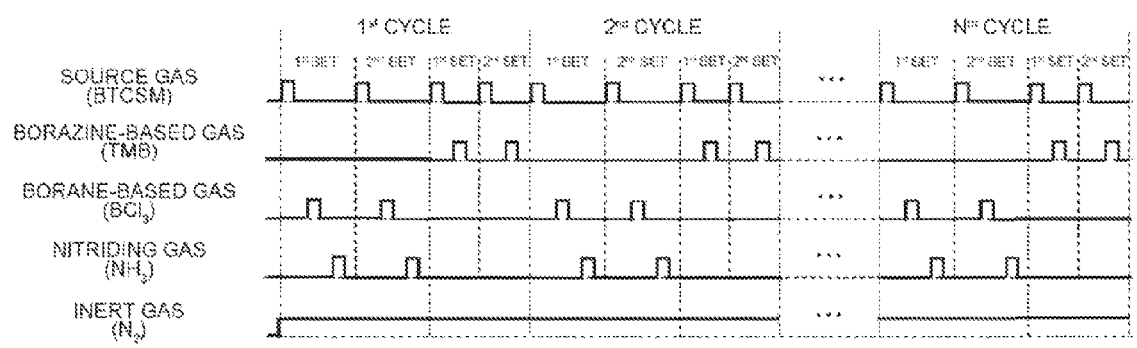
FIGS. 10A and 10B are diagrams illustrating a gas supply timing in Modification 5.

As the modification illustrated in FIG. 10A, a thin film (a nano-laminated film) in which a first film and a second film are alternately laminated at a nano level may be formed on the wafer 200 by performing a cycle a predetermined number of times (n times). The cycle includes a step of forming a SiBCN film having no borazine ring structure as the first film by performing a set a predetermined number of times (m1 times), the set including a step of supplying BTCSM gas as a source gas containing Si, C and a halogen element and including a Si—C bond to the wafer 200, a step of supplying BCl3 gas as a nonborazine-based boron-containing gas to the wafer 200, and a step of supplying NH3 gas as a nitriding gas to the wafer 200, and a step of forming a SiBCN film including a borazine ring structure as the second film by performing a set including the above steps 1 and 2 a predetermined number of times (m2 times). In this case, the number of times each set is performed is controlled such that film thicknesses of the first film and the second film become, for example, 5 nm or less, and preferably, 1 nm or less.

Figure 10B:
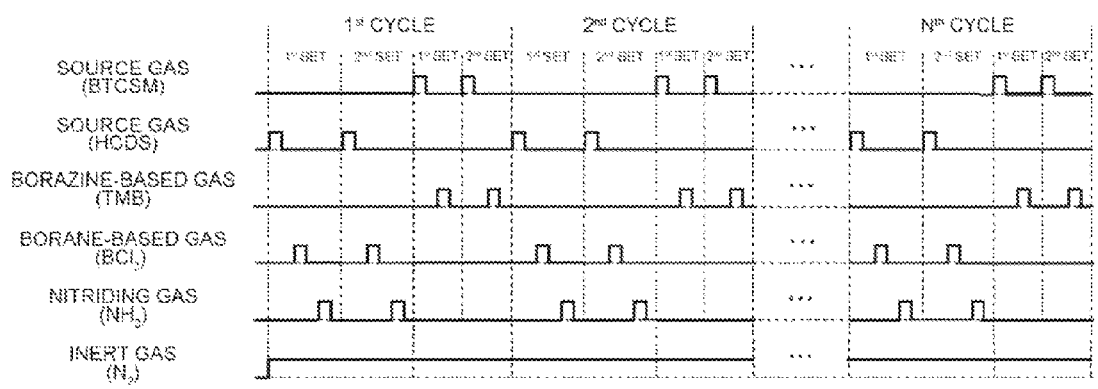

Also, as the modification illustrated in FIG. 10B, a thin film (a nano-laminated film) in which a first film and a second film are alternately laminated at a nano level may be formed on the wafer 200 by performing a cycle a predetermined number of times (n times). The cycle includes a step of forming a SiBN film having no borazine ring structure as the first film by performing a set a predetermined number of times (m1 times), the set including a step of supplying HCDS gas as a source gas containing Si and a halogen element and including a Si—Si bond to the wafer 200, a step of supplying BCl3 gas as a nonborazine-based boron-containing gas to the wafer 200, and a step of supplying NH3 gas as a nitriding gas to the wafer 200, and a step of forming a SiBCN film including a borazine ring structure as the second film by performing a set including the above steps 1 and 2 a predetermined number of times (m2 times). In this case, the number of times each set is performed is controlled such that film thicknesses of the first film and the second film become, for example, 5 nm or less, and preferably, 1 nm or less. Also, in the step of forming the first film, as the source gas, for example, a gas containing Si and a halogen element and having no Si—Si bond such as DCS gas may be used.

In the step of supplying BCl3 gas, on-off control of the valve 243*g* is performed in the same sequence as on-off control of the valves 243*a* and 243*b* in steps 1 and 2. A supply flow rate of BCl3 gas controlled by the MFC 241*g* is set to a flow rate within, for example, a range of 100 sccm to 10,000 sccm. A pressure in the process chamber 201 is set to, for example, a range of 1 Pa to 6,000 Pa. A partial pressure of BCl3 gas in the process chamber 201 is set to, for example, a range of 0.01 Pa to 5,941 Pa. A time for which BCl3 gas is supplied to the wafer 200, that is, a gas supply time (radiation time) is set to, for example, a range of 1 to 120 seconds, and preferably, a range of 1 to 60 seconds. As the nonborazine-based boron-containing gas, in addition to BCl3 gas, a halogenated borane-based gas (haloborane-based gas), for example, a chloro borane-based gas other than BCl3 gas, a fluoro borane-based gas such as boron trifluoride gas (BF3 gas), bromo borane-based gas such as boron tribromide gas (BBr3 gas), or the like may be used. Also, the borane-based gas such as B2H6 gas may be used. Also, in addition to an inorganic borane-based gas, an organic borane-based gas may be used. Other process sequences and process conditions are the same as, for example, the process sequence and process conditions of the film-forming sequence illustrated in FIG. 4A and other modifications.

According to this modification, the same effects as in the film-forming sequence illustrated in FIG. 4A may be obtained and one or a plurality of effects to be described will be obtained.

(a) When the first film and the second film are alternately laminated, it is possible to increase controllability of composition ratio control of the SiBCN film to be finally formed.

A ratio (hereinafter also referred to as a B/N ratio) of a B component to a N component included in the second film that is formed using BTCSM gas and TMB gas is determined by a ratio (1/1 in TMB gas) of the number of B atoms to the number of N atoms included in a molecule of TMB gas, that is, a type of a reactive gas. It is difficult to perform control such that a value has a big difference from this ratio. On the other hand, a B/N ratio of the first film formed using BTCSM gas, BCl3 gas and NH3 gas or a B/N ratio of the first film formed using HCDS gas, BCl3 gas and NH3 gas may be freely controlled by adjusting a ratio of flow rates of BCl3 gas and NH3 gas and the like. Therefore, when the first film and the second film are alternately laminated, if the B/N ratio of the first film and the second film is set to be different, it is possible to perform control such that a B/N ratio of the SiBCN film to be finally formed becomes any value between the B/N ratio of the first film and the B/N ratio of the second film.

Also, in the modification illustrated in FIG. 10A, when the first film and the second film are alternately laminated, if the C concentration of the first film and the C concentration of the second film are set to be different, it is possible to perform control such that a C concentration of the SiBCN film to be finally formed becomes any value between the C concentration of the first film and the C concentration of the second film. Also, in the modification illustrated in FIG. 10B, when the first film without C and the second film containing C are alternately laminated, it is possible to perform control such that a C concentration of the SiBCN film to be finally formed becomes any value less than the C concentration of the second film. Also, in any modification, by controlling a ratio between the film thickness of the first film and the film thickness of the second film, it is possible to finely adjust the C concentration of the SiBCN film to be finally formed.

When the first film and the second film are alternately laminated in this manner, it is possible to perform control such that a composition ratio of the SiBCN film to be finally formed becomes a value that is unachievable when a single film is formed using BTCSM gas and TMB gas or when a single film is formed using BTCSM gas, BCl3 gas and NH3 gas. That is, it is possible to increase a window of composition ratio control.

(b) When the first film and the second film are alternately laminated, it is possible to increase a film density of the SiBCN film to be finally formed, that is, controllability of an atomic density of the film. As a result, it is possible to increase controllability of dielectric constant control of the SiBCN film. The dielectric constant of the second film (porous film) including a borazine ring structure becomes lower than that of the first film (nonporous film) having no borazine ring structure. Accordingly, when the first film and the second film are alternately laminated, it is possible to perform control such that a dielectric constant of the SiBCN film to be finally formed becomes, for example, any value between a dielectric constant of the SiBCN film (single film) including a borazine ring structure that is formed using BTCSM gas and TMB gas and a dielectric constant of the SiBCN film (single film) having no borazine ring structure that is formed using BTCSM gas, BCl3 gas, NH3 gas or the like. That is, when the first film and the second film are alternately laminated, the dielectric constant of the SiBCN film to be finally formed may be set to a value that is unachievable when a single film is formed using BTCSM gas and TMB gas or when a single film is formed using BTCSM gas, BCl3 gas, NH3 gas or the like. Therefore, it is possible to increase a window of dielectric constant control.

(c) When the first film and the second film are alternately laminated, it is possible to increase surface roughness of the SiBCN film to be finally formed. The term "surface roughness" refers to a height difference of wafer in-plane or any target in-plane and has the same meaning as surface irregularity. The phrase "surface roughness is improved (good)" means that "a height difference decreases (small)," that is, "a surface becomes smooth (flat)." The phrase "surface roughness is degraded (bad)" means that "a height difference increases (large)," that is, "a surface becomes rough (coarse)." The first film [non porous film] having no borazine ring structure tends to have better surface roughness than the second film (porous film) including a borazine ring structure. Therefore, when the first film and the second film are alternately laminated, it is possible to improve surface roughness of the SiBCN film to be finally formed. That is, when the first film and the second film are alternately laminated, it is possible to improve the surface roughness of the SiBCN film to be finally formed, compared to when the SiBCN film (single film) including a borazine ring structure is formed using BTCSM gas and TMB gas.

In this case, when the first film is formed before the second film is formed, it is possible to further improve surface roughness of the SiBCN film to be finally formed. That is, before the second film is formed, when the first film having good surface roughness is formed as a base of the formation, the second film formed thereon is influenced by the base, and surface roughness thereof may be improved. As a result, it is possible to further improve surface roughness of the SiBCN film to be finally formed.

Also, in this case, when a film to finally formed is set as the first film, it is possible to further improve surface roughness of the SiBCN film to be finally formed. That is, when the top part of the SiBCN film to be finally formed is configured as the first film having good surface roughness, it is possible to further improve surface roughness of the SiBCN film to be finally formed.

(d) When the first film and the second film are alternately laminated, it is possible to increase controllability of oxidation resistance control of the SiBCN film to be finally formed. The second film including a borazine ring structure includes B as an element of the borazine ring structure forming the film. As described above, a B—N bond forming the borazine ring structure includes a strong bond. Therefore, the second film becomes a film that has less desorption of B from the film due to oxidation and higher oxidation resistance, for example, higher resistance to oxygen plasma, than the first film (nonporous film) having no borazine ring structure, that is, a film having high ash resistance. When the first film and the second film are alternately laminated, it is possible to perform control such that oxidation resistance of the SiBCN film to be finally formed has, for example, any characteristic between the first film and the second film. That is, when the first film and the second film are alternately laminated, oxidation resistance of the SiBCN film to be finally formed may be a characteristic that is unachievable when a single film is formed using BTCSM gas and TMB gas or when a single film is formed using BTCSM gas, BCl3 gas and NH3 gas. That is, it is possible to increase a window of oxidation resistance control, that is, ash resistance control.

(e) When the first film and the second film are alternately laminated in this manner, the SiBCN film to be finally formed may be a film having either or both characteristics of the first film and the second film, a film having an intermediate characteristic of the first film and the second film, or a film having a different characteristic from the first film and the second film. In this case, as described above, film thicknesses of the first film and the second film are preferably set to, for example, 5 nm or less, and preferably, 1 nm or less. When any film of the first film and the second film has a film thickness greater than 5 nm, the SiBCN film to be finally formed may be a film having a non-unified (inconsistent) characteristic in a lamination direction, that is, a film in which the first film and the second film are simply laminated and characteristics are separated in the lamination direction. When film thicknesses of the first film and the second film are set to 5 nm or less, and preferably, 1 nm or less, the SiBCN film to be finally formed may be a film having a consistent characteristic in the lamination direction, that is, a film in which characteristics and properties of the first film and the second film are appropriately merged. That is, film thicknesses of the first film and the second film are set to 5 nm or less, and preferably, 1 nm or less, the SiBCN film to be finally formed may be a nano-laminated film having an integral characteristic as an entire film. Also, when the number of times the above set is performed (m1 times and m2 times) is set to once to 10 times, film thicknesses of the first film and the second film may be 5 nm or less, and preferably, 1 nm or less. Also, as film thicknesses of the first film and the second film become thinner, that is, as the number of times the above set is performed (m1 times and m2 times) become smaller, it is possible to improve surface roughness of the SiBCN film to be finally formed.

(f) In the modification illustrated in FIG. 10A, since both the first film and the second film are films containing C, it is possible to increase the C concentration of the SiBCN film to be finally formed, compared to the modification illustrated in FIG. 10B. Also, when types of the source gas are decreased to one type, since source gas supply lines may be decreased by one line and the structure of the substrate processing apparatus may be simplified. Therefore, it is possible to reduce a manufacturing cost or a maintenance cost.

(g) In the modification illustrated in FIG. 10B, when a gas having high adsorptivity such as HCDS gas is used as the source gas when the first film is formed, it is possible to form the first film more efficiently than that of the modification illustrated in FIG. 10A. As a result, it is possible to increase a film-forming rate of the SiBCN film. Also, since a consumption amount of the source gas that does not contribute to form the film may be decreased, it is possible to decrease a film-forming cost.

Modification 6

Figure 11A:
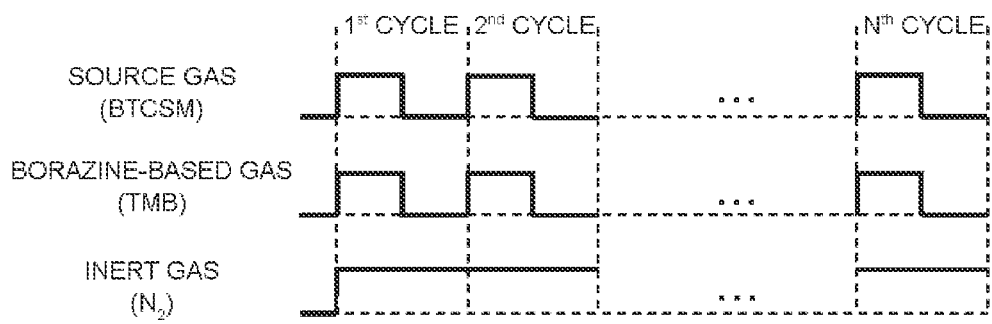
FIGS. 11A to 11E are diagrams illustrating a gas supply timing in Modification 6.
Figure 11B:
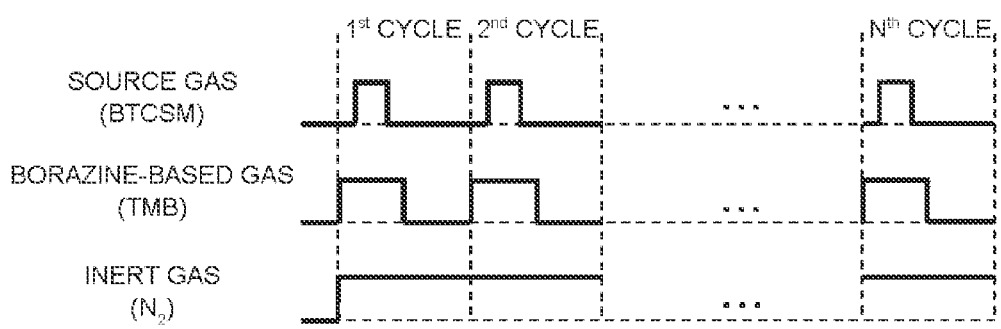
Figure 11C:
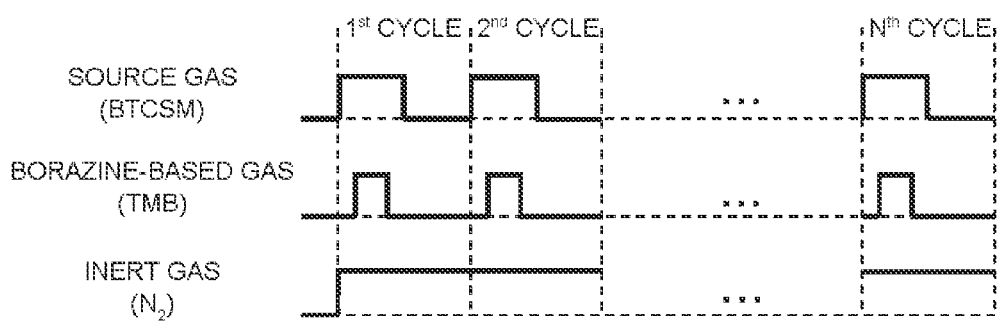
Figure 11D:
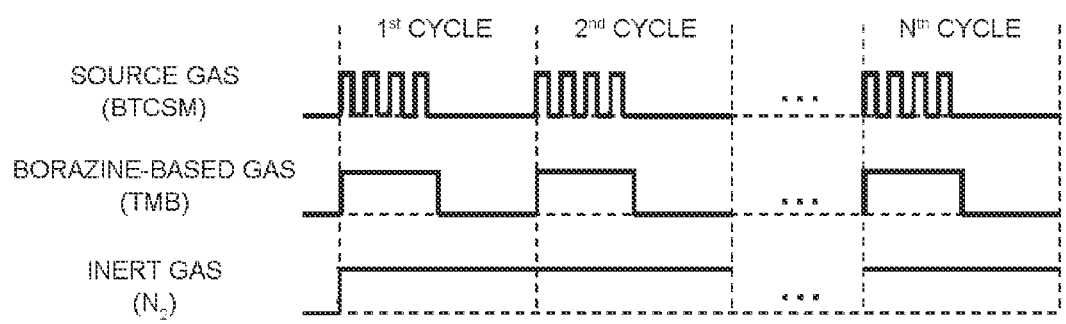
Figure 11E:
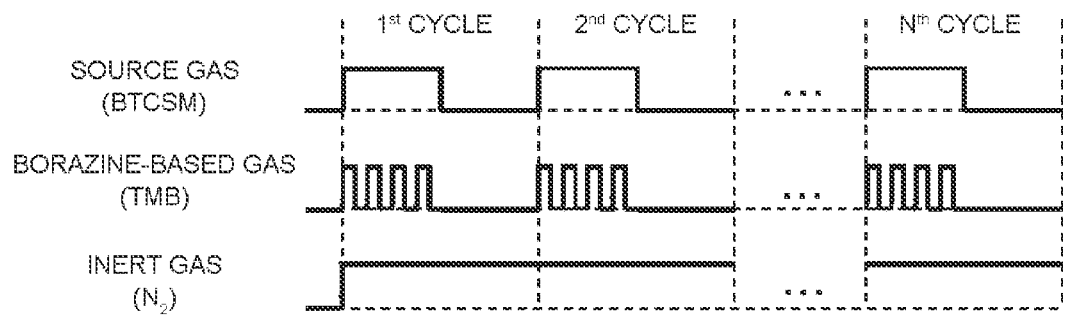
Figure 12A:
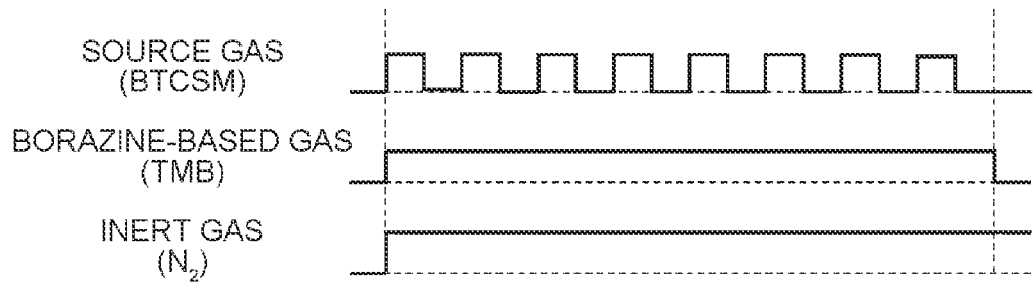
FIGS. 12A to 12C are diagrams illustrating a gas supply timing in Modification 6.
Figure 12B:
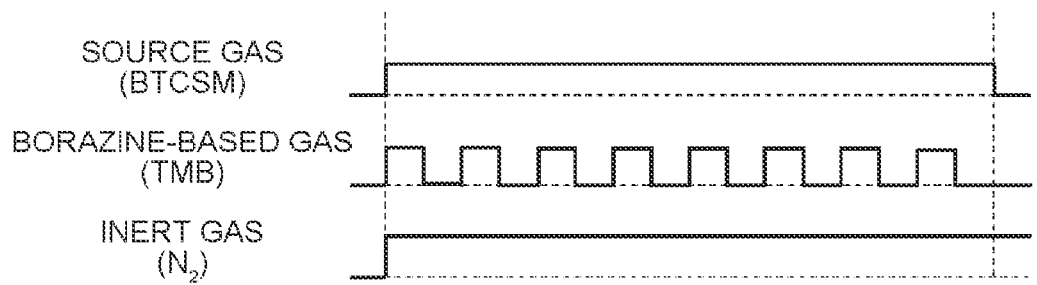
Figure 12C:
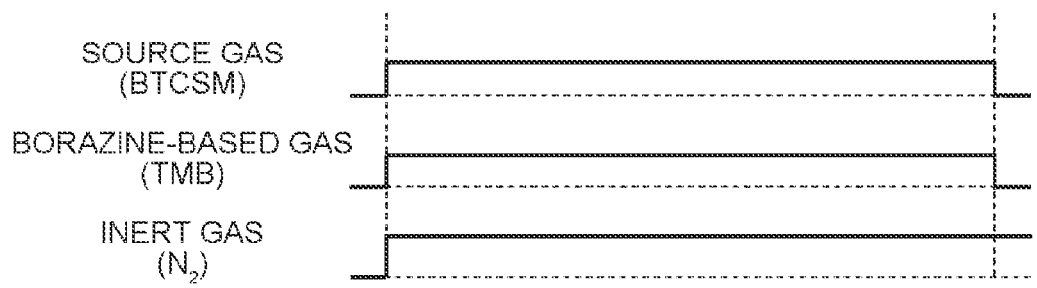

As in the modifications illustrated in FIGS. 11A to 11E and 12A to 12C, a CVD reaction may be generated by performing steps 1 and 2 simultaneously rather than alternately. FIG. 11A illustrates an example in which a cycle in which steps 1 and 2 are simultaneously performed is performed n times. FIG. 12C illustrates an example in which a cycle in which steps 1 and 2 are simultaneously performed is performed once. In this case, as illustrated in FIGS. 11B and 11C, a supply period of BTCSM gas and a supply period of TMB gas may be different. FIGS. 11B and 11C illustrate examples in which, while any gas of BTCSM gas and TMB gas is supplied, the other gas is supplied. Also, as illustrated in FIGS. 11D, 11E, 12A and 12B, while any gas of BTCSM gas and TMB gas is supplied, supply of the other gas is intermittently performed a predetermined number of times (a plurality of times). In these modifications, process conditions may be, for example, the same process conditions as in the film-forming sequence illustrated in FIG. 4A According to this modification, the same effects as in the film-forming sequence illustrated in FIG. 4A may be obtained and one or a plurality of effects to be described will be obtained.

(a) When steps 1 and 2 are simultaneously performed, it is possible to efficiently react BTCSM gas with TMB gas, and it is possible to increase a film-forming rate of the SiBCN film, compared to the film-forming sequence illustrated in FIG. 4A. However, as in the film-forming sequence illustrated in FIG. 4A, when steps 1 and 2 are alternately performed, since BTCSM gas and TMB gas may be appropriately reacted under conditions in which a surface reaction is dominant compared to the modifications illustrated in FIGS. 11A to 11E and 12A to 12C, it is possible to increase wafer in-plane film thickness uniformity or a step coverage characteristic of the SiBCN film to be finally formed. Also, it is possible to avoid a gas-phase reaction in the process chamber 201 and suppress particles from being generated.

(b) In the modifications illustrated in FIGS. 11B and 11C, when steps 1 and 2 are simultaneously performed, supply of any gas of BTCSM gas and TMB gas is performed first, and then supply of the other gas is performed while the gas is sufficiently dispersed in the process chamber 201. Therefore, since a reaction of BTCSM gas and TMB gas may start from a uniform condition across an entire region of the inside of the process chamber 201, it is possible to increase wafer inter-plane film thickness uniformity and wafer in-plane film thickness uniformity of the SiBCN film. Also, even after supply of any gas of BTCSM gas and TMB gas is suspended, supply of the other gas continues. Therefore, it is possible to supplement a gas that is consumed in the reaction of BTCSM gas with TMB gas and maintain reaction efficiency of BTCSM gas and TMB gas. As a result, it is possible to suppress a decrease in the film-forming rate of the SiBCN film. Also, by controlling a supply timing of the gas as described above, a composition ratio of the SiBCN layer formed for a cycle, that is, a composition ratio of the SiBCN film to be finally formed, may be uniformized in a thickness direction.

(c) In the modifications illustrated in FIGS. 11D and 11E, while any gas of BTCSM gas and TMB gas is supplied, when supply of the other gas is intermittently performed a predetermined number of times, it is possible to appropriately suppress a reaction of BTCSM gas and TMB gas, and it is possible to increase wafer in-plane film thickness uniformity or a step coverage characteristic of the SiBCN film to be finally formed, compared to the modification illustrated in FIG. 11A. Also, in the modifications illustrated in FIGS. 12A and 12B, for the same reason, it is possible to increase wafer in-plane film thickness uniformity or a step coverage characteristic of the SiBCN film to be finally formed, compared to the modification illustrated in FIG. 12C.

Other Embodiments of the Present Invention

While the embodiments of the present invention have been specifically described above, the present invention is not limited to the above-described embodiments, but may be variously modified without departing from the scope of the invention.

For example, in the above-described embodiment, the example in which the source gas is supplied and then the reactive gas is supplied has been described, but a supply sequence of gases may be reversed. That is, the reactive gas is supplied and then the source gas may be supplied. In other words, either the source gas or the reactive gas is supplied first, and then the other gas may be supplied. When the supply sequence of the gases is changed in the manner, it is possible to change film quality or a composition ratio of a thin film to be formed.

When a silicon-based insulating film formed by the method of the above-described embodiments or modifications is used as a sidewall spacer, it is possible to provide a technique forming a device having a low leakage current and excellent workability. Also, when the above silicon-based insulating film is used as an etching stopper, it is possible to provide a technique forming a device having excellent workability. Also, according to the above-described embodiments and some modifications, it is possible to form a silicon-based insulating film having an ideal stoichiometric ratio without using plasma. Since the silicon-based insulating film may be formed without using plasma, adaptation to a process with concerns about plasma damage, for example, a SADP film of DPT may be possible.

In the above-described embodiment, the example in which the silicon-based insulating film (the SiBCN film) containing a semiconductor element Si is formed as a borocarbonitride film containing a predetermined element has been described. However, the present invention may be applied when a metal-based thin film containing a metal element, for example, titanium (Ti), zirconium (Zr), hafnium (Hf), tantalum (Ta), aluminum (Al), or molybdenum (Mo) is formed.

That is, the present invention may be preferably used when a metal borocarbonitride film, for example, a titanium borocarbonitride film (TiBCN film), a zirconium borocarbonitride film (ZrBCN film), a hafnium borocarbonitride film (HfBCN film), a tantalum borocarbonitride film (TaBCN film), an aluminum borocarbonitride film (AlBCN film), or a molybdenum borocarbonitride film (MoBCN film) is formed. In this case, film-forming may be performed in the same sequence as in the above-described embodiment using a source gas containing a metal element as the source gas, instead of the source gas containing Si in the above-described embodiment.

When a metal-based thin film (TiBCN film) containing Ti is formed, as a source gas containing Ti, a source gas containing Ti, C and a halogen element and including a Ti—C bond, or a source gas containing Ti and a halogen element may be used. As the source gas containing Ti and a halogen element, for example, a source gas containing Ti and a chloro group such as titanium tetrachloride ($TiCl_4$) or a source gas containing Ti and a fluoro group such as titanium tetrafluoride ($TiF_4$) may be used. As the reactive gas, the carbon-containing gas, the nitriding gas, the gas containing N and C, and the boron-containing gas, the same gases as in the above-described embodiment may be used. Process conditions in this case may be, for example, the same as in the above-described embodiment.

When a metal-based thin film (ZrBCN film) containing Zr is formed, as a source gas containing Zr, a source gas containing Zr, C and a halogen element and including a Zr—C bond or a source gas containing Zr and a halogen element may be used. As the source gas containing Zr and a halogen element, for example, a source gas containing Zr and a chloro group such as zirconium tetrachloride ($ZrCl_4$) or a source gas containing Zr and a fluoro group such as zirconium tetrafluoride ($ZrF_4$) may be used. As the reactive gas, the carbon-containing gas, the nitriding gas, the gas containing N and C, and the boron-containing gas, the same gases as in the above-described embodiment may be used. Process conditions in this case may be, for example, the same as in the above-described embodiment.

When a metal-based thin film (HfBCN film) containing Hf is formed, as a source gas containing Hf, a source gas containing Hf, C and a halogen element and including a Hf—C bond or a source gas containing Hf and a halogen element may be used. As the source gas containing Hf and a halogen element, for example, a source gas containing Hf and a chloro group such as hafnium tetrachloride ($HfCl_4$) or a source gas containing Hf and a fluoro group such as hafnium tetrafluoride ($HfF_4$) may be used. As the reactive gas, the carbon-containing gas, the nitriding gas, the gas containing N and C, and the boron-containing gas, the same gases as in the above-described embodiment may be used. Process conditions in this case may be, for example, the same as in the above-described embodiment.

When a metal-based thin film (TaBCN film) containing Ta is formed, as a source gas containing Ta, a source gas containing Ta, C and a halogen element and including a Ta—C bond or a source gas containing Ta and a halogen element may be used. As the source gas containing Ta and a halogen element, for example, a source gas containing Ta and a chloro group such as tantalum pentachloride ($TaCl_5$) or a source gas containing Ta and a fluoro group such as tantalum pentafluoride ($TaF_5$) may be used. As the reactive gas, the carbon-containing gas, the nitriding gas, the gas containing N and C, and the boron-containing gas, the same gases as in the above-described embodiment may be used. Process conditions in this case may be, for example, the same as in the above-described embodiment.

When a metal-based thin film (AlBCN film) containing Al is formed, as a source gas containing Al, a source gas containing Al, C and a halogen element and including an Al—C bond or a source gas containing Al and a halogen element may be used. As a source gas containing Al and a halogen element, for example, a source gas containing Al and a chloro group such as aluminum trichloride ($AlCl_3$) or a source gas containing Al and a fluoro group such as aluminum trifluoride ($AlF_3$) may be used. As the reactive gas, the carbon-containing gas, the nitriding gas, the gas containing N and C, and the boron-containing gas, the same gases as in the above-described embodiment may be used. Process conditions in this case may be, for example, the same as in the above-described embodiment.

When a metal-based thin film (MoBCN film) containing Mo is formed, as a source gas containing Mo, a source gas containing Mo, C and a halogen element and including a Mo—C bond or a source gas containing Mo and a halogen element may be used. As the source gas containing Mo and a halogen element, for example, a source gas containing Mo and a chloro group such as molybdenum pentachloride ($MoCl_5$) or a source gas containing Mo and a fluoro group such as molybdenum pentafluoride ($MoF_5$) may be used. As the reactive gas, the carbon-containing gas, the nitriding gas, the gas containing N and C, and the boron-containing gas, the same gases as in the above-described embodiment may be used. Process conditions in this case may be, for example, the same as in the above-described embodiment.

That is, the present invention may be preferably applied when a thin film containing a predetermined element such as a semiconductor element or a metal element is formed.

A process recipe (a program in which process sequences, process conditions or the like is described) used in the formation of various types of thin films may preferably be separately prepared (prepared in a plurality of recipes) according to content (a film type, a composition ratio, film quality, a film thickness, and the like of a thin film to be formed) of substrate processing. Then, when the substrate processing starts, an appropriate process recipe is preferably appropriately selected from among the plurality of process recipes according to content of the substrate processing. Specifically, the plurality of process recipes separately prepared according to content of the substrate processing are preferably stored (installed) in advance in the memory device 121c provided in the substrate processing apparatus through telecommunication lines or the non-transitory computer-readable recording medium [the external memory device 123] recording the process recipe. Then, when the substrate processing starts, the CPU 121a provided in the substrate processing apparatus preferably appropriately selects an appropriate process recipe according to content of the substrate processing from among the plurality of process recipes stored in the memory device 121c. In such a configuration, it is possible to generally and repeatedly form the thin film having various film types, composition ratios, film qualities, and film thicknesses in the single substrate processing apparatus. In addition, it is possible to decrease an operation load (such as a load for inputting processing sequences or processing conditions) of an operator, thereby preventing operation errors and quickly starting the substrate processing.

In addition to creating a new process recipe, the above-described process recipe may be prepared by, for example, changing an existing process recipe that is previously installed in the substrate processing apparatus. When the process recipe is changed, the changed process recipe may be installed in the substrate processing apparatus through the telecommunication lines or the non-transitory computer-readable recording medium recording the process recipe. Also, by manipulating the I/O device 122 provided in the existing substrate processing apparatus, the existing process recipe that is previously installed in the substrate processing apparatus may be directly changed.

In the above-described embodiment, the example in which the thin film is formed using the batch-type substrate processing apparatus that processes the plurality of substrates at once has been described. However, the present invention is not limited to the above-described embodiment, but may be preferably applied to, for example, when the thin film is formed using a single substrate processing apparatus that processes one or several substrates at once. In addition, in the above-described embodiment, the example in which the thin film is formed using the substrate processing apparatus including a hot wall-type processing furnace has been described. However, the present invention is not limited to the above-described embodiment, but may be preferably applied when the thin film is formed using a substrate processing apparatus including a cold wall-type processing furnace. In this case, process conditions may be, for example, the same as in the above-described embodiment.

Also, the above-described embodiments, modifications, or the like may be appropriately combined and used. Also, process conditions in this case may be, for example, the same as in the above-described embodiment.

According to the present invention, it is possible to form a thin film having a high resistance to HF and a low dielectric constant with high productivity.

Exemplary Embodiments of the Present Invention
the Present Invention

Hereinafter, exemplary embodiments of the present invention are added.

Supplementary Note 1

According to an embodiment of the present invention, there is provided a method of manufacturing a semiconductor device, including performing a cycle a predetermined number of times, the cycle including: (a) supplying a source gas containing a predetermined element, carbon and a halogen element and having a chemical bond between the predetermined element and carbon to a substrate; and (b) supplying a reactive gas including a borazine compound to the substrate, wherein the cycle is performed under a condition where a borazine ring structure in the borazine compound and at least a portion of the chemical bond between the predetermined element and carbon in the source gas are preserved to form a thin film including the borazine ring structure and the chemical bond between the predetermined element and carbon on the substrate.

Supplementary Note 2

In the method of Supplementary note 1, preferably, a first layer containing the predetermined element, carbon and the halogen element is formed in the step (a), and a second layer containing the predetermined element, carbon and the borazine ring structure is formed by reacting the first layer with the borazine compound to modify the first layer in the step (b).

Supplementary Note 3

In the method of Supplementary note 2, preferably, the halogen element included in the first layer is reacted with a ligand included in the borazine compound in the step (b).

Supplementary Note 4

In the method of Supplementary note 2 or 3, preferably, the step (b) is performed under a condition where the halogen element included in the first layer reacts with the ligand included in the borazine compound.

Supplementary Note 5

In the method of any one of Supplementary notes 2 to 4, preferably, a temperature of the substrate is set to a temperature whereat the halogen element included in the first layer reacts with the ligand included in the borazine compound in the step (b).

Supplementary Note 6

In the method of any one of Supplementary notes 1 to 5, preferably, the steps (a) and (b) are alternately performed a predetermined number of times when forming the thin film.

Supplementary Note 7

In the method of any one of Supplementary notes 1 to 5, preferably, the steps (a) and (b) are simultaneously performed a predetermined number of times when forming the thin film.

Supplementary Note 8

In the method of any one of Supplementary notes 1 to 7, preferably, the cycle further includes (c) supplying at least one selected from a group consisting of a nitriding gas (nitrogen-containing gas), a carbon-containing gas, and a gas containing nitrogen and carbon to the substrate.

Supplementary Note 9

In the method of any one of Supplementary notes 1 to 7, preferably, the cycle further includes (d) supplying a nitriding gas (nitrogen-containing gas) to the substrate.

Supplementary Note 10

In the method of Supplementary note 9, preferably, the nitriding gas which is thermally activated is supplied to the substrate in the step (d).

Supplementary Note 11

In the method of Supplementary note 9, preferably, the nitriding gas which is plasma-activated is supplied to the substrate in the step (d).

Supplementary Note 12

In the method of any one of Supplementary notes 1 to 7, preferably, the cycle further includes (e) supplying a carbon-containing gas to the substrate.

Supplementary Note 13

In the method of any one of Supplementary notes 1 to 7, preferably, the cycle further includes (f) supplying a gas containing nitrogen and carbon to the substrate.

Supplementary Note 14

In the method of any one of Supplementary notes 1 to 13, preferably, the cycle is performed the predetermined number of times under a non-plasma atmosphere (condition).

Supplementary Note 15

In the method of any one of Supplementary notes 1 to 14, preferably, the thin film is a thin film including the borazine ring structure and containing the predetermined element, boron, carbon and nitrogen, or a thin film including the borazine ring structure and containing the predetermined element, boron and nitrogen. Also, when the thin film including the borazine ring structure and containing the predetermined element, boron and nitrogen is formed, the cycle may be performed under a condition where the chemical bond between the predetermined element and carbon in the source gas is not preserved.

Supplementary Note 16

According to another embodiment of the present invention, there is provided a method of manufacturing a semiconductor device, including performing a cycle a predetermined number of times, the cycle including: (a) supplying a first source gas containing a predetermined element and a halogen element and having a chemical bond between the predetermined elements to a substrate; (b) supplying a second source gas containing the predetermined element, carbon and a halogen element and having a chemical bond between the predetermined element and carbon to the substrate; and (c) supplying a reactive gas including a borazine compound to the substrate, wherein the cycle is performed under a condition where a borazine ring structure in the borazine compound and at least a portion of the chemical bond between the predetermined element and carbon in the second source gas are preserved to form a thin film including the chemical bond between the predetermined element and carbon and the borazine ring structure on the substrate.

Supplementary Note 17

In the method of Supplementary note 16, preferably, a seed layer containing the predetermined element and the halogen element is formed in the step (a), a first layer containing the predetermined element, carbon and the halogen element is formed on the seed layer in the step (b), and a second layer containing the predetermined element, carbon and the borazine ring structure is formed by reacting the seed layer and the first layer with the borazine compound to modify the seed layer and the first layer in the step (c).

Supplementary Note 18

According to still another embodiment of the present invention, there is provided a method of manufacturing a semiconductor device, including performing a cycle a predetermined number of times, the cycle including: (a) performing a first set a predetermined number of times, the first set including (a-1) supplying a first source gas containing a predetermined element and a halogen element to a substrate; (a-2) supplying a boron-containing gas to the substrate; and (a-3) supplying a nitriding gas (nitrogen-containing gas) to the substrate to form a film including the predetermined element, boron, carbon and nitrogen or a film including the predetermined element, boron and nitrogen as a first film; and (b) performing a second set a predetermined number of times, the second set including (b-1) supplying a second source gas containing the predetermined element, carbon and the halogen element and having a chemical bond between the predetermined element and carbon to the substrate and (b-2) supplying a reactive gas including a borazine compound to the substrate to form a film including the chemical bond between the predetermined element and carbon and the borazine ring structure as a second film, wherein the second set is performed under a condition where the borazine ring structure in the borazine compound and at least a portion of the chemical bond between the predetermined element and carbon in the second source gas are preserved, to form a thin film (a nano-laminated film) in which the first film and the second film are alternately laminated (alternately laminated at a nano level) on the substrate.

Supplementary Note 19

In the method of Supplementary note 18, preferably, the first source gas includes the predetermined element, carbon and the halogen element and includes a chemical bond between the predetermined element and carbon, a first layer containing the predetermined element, carbon and the halogen element is formed in the step (a-1), a second layer containing the predetermined element, boron and carbon is formed by forming a boron-containing layer on the first layer or by reacting the first layer with the boron-containing gas to modify the first layer in the step (a-2), a layer containing the predetermined element, boron, carbon and nitrogen or a layer containing the predetermined element, boron and nitrogen is formed as a third layer by reacting the second layer with the nitriding gas to modify the second layer in the step (a-3), a fourth layer containing the predetermined element, carbon and the halogen element is formed in the step (b-1), and a fifth layer containing the predetermined element, carbon and the borazine ring structure is formed by reacting the fourth layer with the borazine compound to modify the fourth layer in the step (b-2).

Supplementary Note 20

In the method of Supplementary note 18, preferably, the first source gas includes the predetermined element and the halogen element and has a chemical bond between the predetermined elements, a first layer containing the predetermined element and the halogen element is formed in the step (a-1), a second layer containing the predetermined element and boron is formed by forming a boron-containing layer on the first layer or by reacting the first layer with the boron-containing gas to modify the first layer in the step (a-2), a third layer containing the predetermined element, boron and nitrogen is formed by reacting the second layer with the nitriding gas to modify the second layer in the step (a-3), a fourth layer containing the predetermined element, carbon and the halogen element is formed in the step (b-1), and a fifth layer containing the predetermined element, carbon and the borazine ring structure is formed by reacting the fourth layer with the borazine compound to modify the fourth layer in the step (b-2).

Supplementary Note 21

According to yet another embodiment of the present invention, there is provided a substrate processing method, including performing a cycle a predetermined number of times, the cycle including: (a) supplying a source gas containing a predetermined element, carbon and a halogen element and having a chemical bond between the predetermined element and carbon to a substrate; and (b) supplying a reactive gas including a borazine compound to the substrate, wherein the cycle is performed under a condition where a borazine ring structure in the borazine compound and at least a portion of the chemical bond between the predetermined element and carbon in the source gas are preserved to form a thin film including the borazine ring structure and the chemical bond between the predetermined element and carbon on the substrate.

Supplementary Note 22

According to yet another embodiment of the present invention, there is provided a substrate processing apparatus including: a process chamber configured to accommodate a substrate; a source gas supply system configured to supply a source gas containing a predetermined element, carbon and a halogen element and having a chemical bond between the predetermined element and carbon to the substrate in the process chamber; a reactive gas supply system configured to supply a reactive gas including a borazine compound to the substrate in the process chamber; a heater configured to heat the substrate in the process chamber; a pressure regulator configured to regulate an inside pressure of the process chamber; and a control unit configured to control the source gas supply system, the reactive gas supply system, the heater, and the pressure regulator to perform a cycle a predetermined number of times, the cycle including: (a) supplying the source gas to the substrate in the process chamber; and (b) supplying the reactive gas to the substrate in the process chamber, wherein the cycle is performed under a condition where a borazine ring structure in the borazine compound and at least a portion of the chemical bond between the predetermined element and carbon in the source gas are preserved to form a thin film including the borazine ring structure and the chemical bond between the predetermined element and carbon on the substrate.

Supplementary Note 23

According to yet another embodiment of the present invention, there are provided a program and a non-transitory computer-readable recording medium storing a program for causing a computer to perform a cycle a predetermined number of times, the cycle including: (a) supplying a source gas containing a predetermined element, carbon and a halogen element and having a chemical bond between the predetermined element and carbon to a substrate in a process chamber; and (b) supplying a reactive gas including a borazine compound to the substrate in the process chamber, wherein the cycle is performed under a condition where a borazine ring structure in the borazine compound and at least a portion of the chemical bond between the predetermined element and carbon in the source gas are preserved to form a thin film including the borazine ring structure and the chemical bond between the predetermined element and carbon on the substrate.

What is claimed is:

1. A method of manufacturing a semiconductor device, comprising performing a cycle a predetermined number of times, the cycle comprising:
   (a) supplying a source gas containing a predetermined element, carbon and a halogen element and having a chemical bond between the predetermined element and carbon to a substrate; and
   (b) supplying a reactive gas including a borazine compound to the substrate,
   wherein the cycle is performed under a condition where a borazine ring structure in the borazine compound and at least a portion of the chemical bond between the predetermined element and carbon in the source gas are preserved to form a thin film including the borazine ring structure and the chemical bond between the predetermined element and carbon on the substrate.

2. The method of claim 1, wherein a first layer containing the predetermined element, carbon and the halogen element is formed in (a), and
   a second layer containing the predetermined element, carbon and the borazine ring structure is formed by reacting the first layer with the borazine compound to modify the first layer in (b).

3. The method of claim 2, wherein the halogen element included in the first layer is reacted with a ligand included in the borazine compound in (b).

4. The method of claim 2, wherein (b) is performed under a condition where the halogen element included in the first layer reacts with the ligand included in the borazine compound.

5. The method of claim 2, wherein a temperature of the substrate is set to a temperature whereat the halogen element included in the first layer reacts with the ligand included in the borazine compound in (b).

6. The method of claim 1, wherein (a) and (b) are alternately performed a predetermined number of times when forming the thin film.

7. The method of claim 1, wherein (a) and (b) are simultaneously performed a predetermined number of times when forming the thin film.

8. The method of claim 1, wherein the cycle further comprises (c) supplying at least one selected from a group consisting of a nitriding gas, a carbon-containing gas, and a gas containing nitrogen and carbon to the substrate.

9. The method of claim 1, wherein the cycle further comprises (c) supplying a nitriding gas to the substrate.

10. The method of claim 9, wherein the nitriding gas which is thermally activated is supplied to the substrate in (c).

11. The method of claim 9, wherein the nitriding gas which is plasma-activated is supplied to the substrate in (c).

12. The method of claim 1, the cycle further comprises (c) supplying a carbon-containing gas to the substrate.

13. The method of claim 1, wherein the cycle further comprises (c) supplying a gas containing nitrogen and carbon to the substrate.

14. The method of claim 1, wherein the cycle is performed the predetermined number of times under a non-plasma condition.

* * * * *